US011137647B2

(12) United States Patent
Fujikawa

(10) Patent No.: US 11,137,647 B2
(45) Date of Patent: Oct. 5, 2021

(54) ELECTRO-OPTICAL DEVICE AND ELECTRONIC APPARATUS

(71) Applicant: SEIKO EPSON CORPORATION, Tokyo (JP)

(72) Inventor: Shinsuke Fujikawa, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/800,013

(22) Filed: Feb. 25, 2020

(65) Prior Publication Data

US 2020/0271978 A1    Aug. 27, 2020

(30) Foreign Application Priority Data

Feb. 26, 2019   (JP) .............................. JP2019-032430

(51) Int. Cl.
| | | |
|---|---|---|
| *H05K 7/00* | (2006.01) | |
| *G02F 1/1345* | (2006.01) | |
| *H05K 1/14* | (2006.01) | |
| *G02F 1/1362* | (2006.01) | |
| *H05K 1/18* | (2006.01) | |
| *H05K 1/02* | (2006.01) | |
| *G02F 1/1368* | (2006.01) | |

(52) U.S. Cl.
CPC .... *G02F 1/13452* (2013.01); *G02F 1/136204* (2013.01); *H05K 1/0268* (2013.01); *H05K 1/144* (2013.01); *H05K 1/189* (2013.01); *G02F 1/1368* (2013.01); *H05K 2201/09281* (2013.01); *H05K 2201/10136* (2013.01)

(58) Field of Classification Search
CPC .......... G02F 1/13452; G02F 1/136204; G02F 1/1368; H05K 1/144; H05K 1/189; H05K 1/0268; H05K 2201/10136; H05K 2201/09281; H05K 2201/10128; H05K 1/147; G09G 3/3648
See application file for complete search history.

(56) References Cited

U.S. PATENT DOCUMENTS

| | | | | |
|---|---|---|---|---|
| 5,774,100 | A * | 6/1998 | Aoki ..................... | G09G 3/006 345/87 |
| 2001/0022568 | A1 | 9/2001 | Kang | |
| 2006/0202638 | A1* | 9/2006 | Kubota ................. | H05B 45/60 315/291 |

(Continued)

FOREIGN PATENT DOCUMENTS

| | | |
|---|---|---|
| JP | 2001-311962 A | 11/2001 |
| JP | 2004-184839 A | 7/2004 |

(Continued)

*Primary Examiner* — Yuriy Semenenko
(74) *Attorney, Agent, or Firm* — Oliff PLC

(57) ABSTRACT

A liquid crystal apparatus includes a first wiring substrate on which a first driving IC is mounted, a second wiring substrate disposed to overlap the first wiring substrate, a first terminal group electrically connected to the first wiring substrate and including a terminal electrically connected to the first driving IC, a second terminal group electrically connected to the second wiring substrate and including another terminal electrically connected to the terminal, and a monitoring pad provided on the second wiring substrate and electrically connected to the other terminal.

8 Claims, 20 Drawing Sheets

(56) References Cited

U.S. PATENT DOCUMENTS

| | | | |
|---|---|---|---|
| 2009/0179835 A1* | 7/2009 | Ito | G09G 3/34 |
| | | | 345/76 |
| 2011/0175800 A1 | 7/2011 | Mizumaki | |
| 2012/0236514 A1* | 9/2012 | Saimen | G02F 1/13452 |
| | | | 361/749 |
| 2013/0037803 A1* | 2/2013 | Kim | H01L 22/32 |
| | | | 257/48 |
| 2017/0184903 A1* | 6/2017 | Fujikawa | G02F 1/13452 |
| 2018/0031937 A1* | 2/2018 | Takahashi | G02F 1/136286 |
| 2018/0224676 A1* | 8/2018 | Yoshii | G02F 1/0018 |
| 2018/0228018 A1* | 8/2018 | Yoshii | H05K 5/0017 |
| 2018/0228037 A1 | 8/2018 | Fujikawa | |

FOREIGN PATENT DOCUMENTS

| | | |
|---|---|---|
| JP | 2004-259750 A | 9/2004 |
| JP | 2010-102219 A | 5/2010 |
| JP | 2018017790 * | 2/2018 |
| JP | 2018-128498 A | 8/2018 |
| JP | 2018-128499 A | 8/2018 |
| WO | 2010/016312 A1 | 2/2010 |

* cited by examiner

ELECTRO-OPTICAL DEVICE AND ELECTRONIC APPARATUS

The present application is based on, and claims priority from JP Application Serial Number 2019-032430, filed Feb. 26, 2019, the disclosure of which is hereby incorporated by reference herein in its entirety.

BACKGROUND

1. Technical Field

The present disclosure relates to an electro-optical device and an electronic apparatus including the electro-optical device.

2. Related Art

Known examples of an electro-optical device include an active drive type liquid crystal apparatus and an organic electroluminescence device in which pixels include transistors used as switching elements. Such an electro-optical device includes an electro-optical panel with a display region in which a plurality of pixels are disposed. An implementation may be employed in which a flexible wiring substrate equipped with a driving integrated circuit (IC) is coupled to the terminal portion of the electro-optical panel via an anisotropic conductive film or the like.

In recent years, in connection with the above-described embodiments, there has been a demand to support an increasing number of pixels in order to achieve an increased resolution of the electro-optical panel. Thus, an implementation in which two flexible wiring substrates are disposed in an overlapping manner may be employed. For example, Japanese Unexamined Patent Application Publication No. 2018-128498 and Japanese Unexamined Patent Application 2018-128499 disclose a technology for electrically coupling a power supply terminal between a first terminal group and a second terminal group to which two flexible wiring substrates mounted in an overlapping manner are coupled.

For the electro-optical panel in which the flexible wiring substrates including the driving ICs are coupled, display tests are performed by inputting testing video signals to the electro-optical panel. When a display error occurs, which of the electro-optical panel, the flexible wiring substrate, and the driving IC has caused the error is determined. Thus, the wiring of the flexible wiring substrate electrically coupled to an output terminal of the driving IC is checked for the state of output signals. Alternatively, the power supply to the electro-optical panel or the driving IC may be checked for noise.

However, in the implementations described in Japanese Unexamined Patent Application Publication No. 2018-128498 and Japanese Unexamined Patent Application Publication No. 2018-128499, there is a problem in that checking the wiring of the flexible wiring substrate for output signals and power supply noise is difficult. In particular, because the two flexible wiring substrates are disposed in a substantially overlapping manner, when the wiring of one of the wiring substrates is present on the inner side of the two wiring substrates, it is difficult to bring an inspection probe into contact with the wiring to conduct checks on output signals and power supply noise. In other words, there has been a demand for an electro-optical device facilitating checking of the wiring substrates for output signals and power supply noise.

SUMMARY

An electro-optical device according to the present application includes a first wiring substrate on which a first driving element is mounted, a second wiring substrate disposed to overlap the first wiring substrate, a first terminal group electrically connected to the first wiring substrate and including a first terminal electrically connected to the first driving element, a second terminal group electrically connected to the second wiring substrate and including a second terminal electrically connected to the first terminal, and a monitor unit provided on the second wiring substrate and electrically connected to the second terminal.

The electro-optical device described above may be configured such that the monitor unit is not electrically connected to the second driving element mounted on the second wiring substrate.

In the electro-optical device described above, the second wiring substrate may be provided with a disconnection portion at which wiring electrically connecting the second driving element mounted on the second wiring substrate and the monitor unit is disconnected.

The electro-optical device may include a connecting portion configured to electrically connect the first terminal and the second terminal, and the connecting portion may be provided in a layer below a layer in which the first terminal and the second terminal are provided.

In the electro-optical device described above, the monitor unit may be disposed closer to the second terminal group than other monitor unit electrically connected to the second driving element.

In the electro-optical device described above, the first terminal group may include a third terminal electrically connected to the first driving element, the second terminal group may include a fourth terminal electrically connected to the third terminal, and the second wiring circuit may include other monitor unit electrically connected to the fourth terminal.

An electronic apparatus according to an aspect of the disclosure includes the above-described electro-optical device.

DESCRIPTION OF EXEMPLARY EMBODIMENTS

Embodiments of the present disclosure will be described below with reference to the accompanying drawings. The embodiments described below describe an example of the present invention. The present invention is not limited to the embodiments described below, and various modified examples implemented without departing from the spirits of the present invention are also included in the present invention. In this regard, in the figures described below, to be illustrated in sizes appropriate for discerning, members are not be drawn to scale. Additionally, in each of the following figures, an X axis, a Y axis, and a Z axis are illustrated as mutually orthogonal coordinate axes necessary.

1. First Embodiment 1.1. Liquid Crystal Apparatus

In the present embodiment, an active drive type liquid crystal apparatus will be described as an example of an electro-optical device. The liquid crystal apparatus is a micro device applied to an optical modulation device of a projection-type display apparatus, which will be described below.

Figure 1:
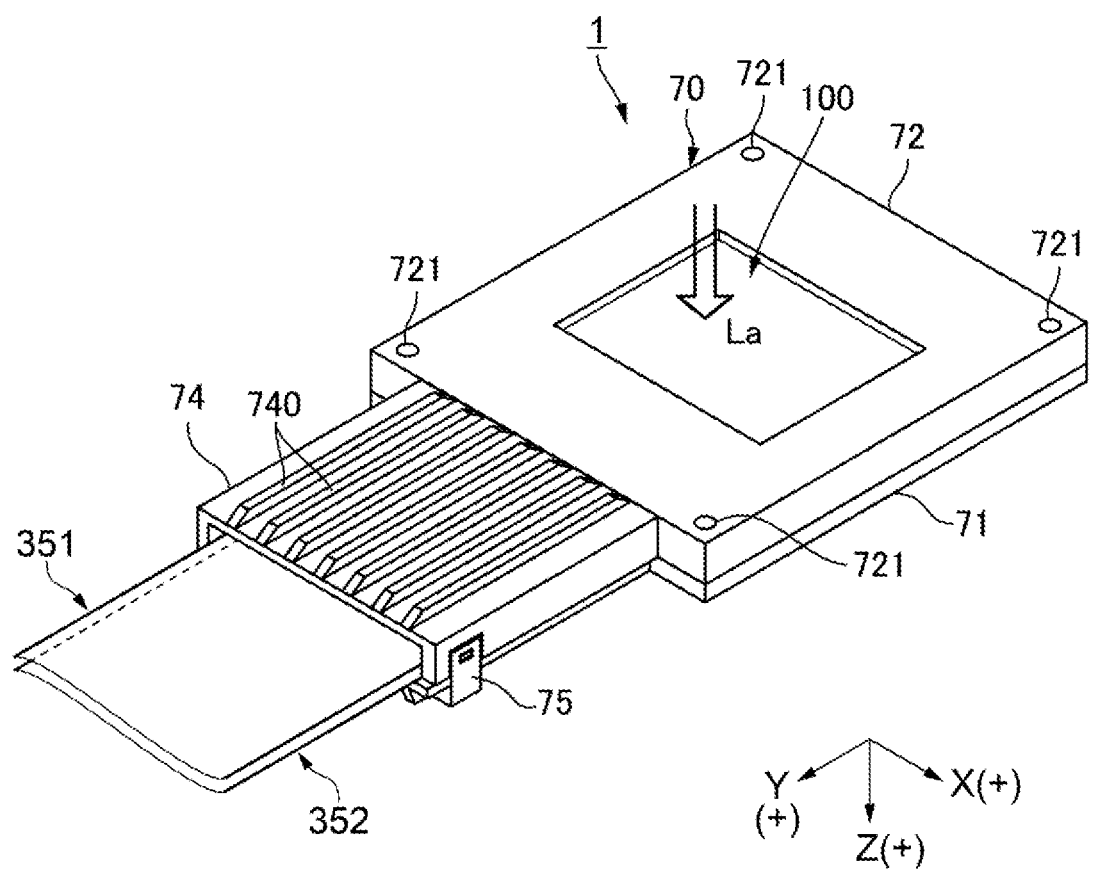
FIG. 1 is a perspective view illustrating a visual appearance of a liquid crystal apparatus as an electro-optical device according to a first embodiment.
Figure 2:
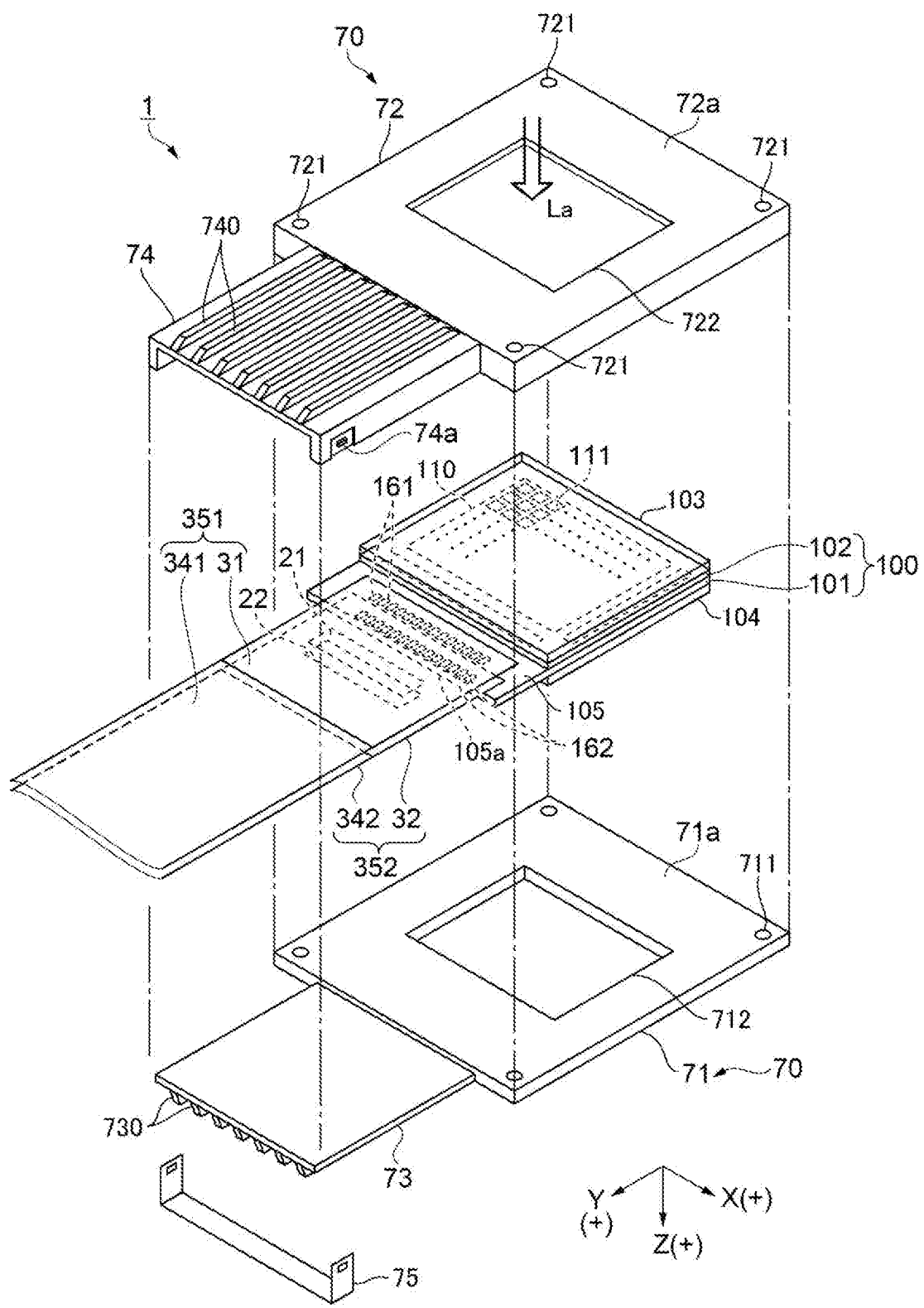
FIG. 2 is an exploded perspective view illustrating a configuration of the liquid crystal apparatus.
Figure 3:
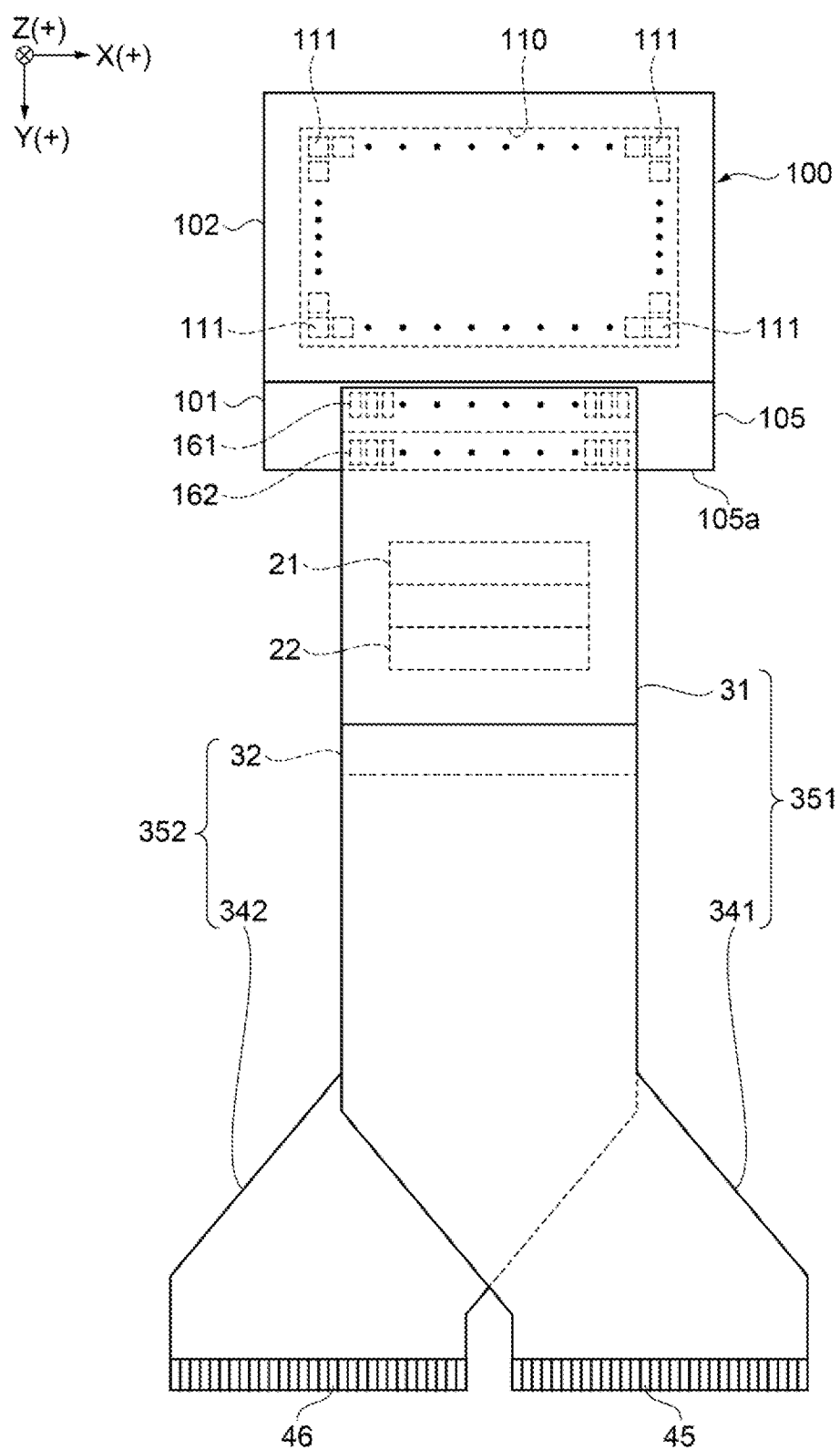
FIG. 3 is a plan view illustrating a liquid crystal panel in which a first wiring substrate and a second wiring substrate are electrically coupled.
Figure 4:
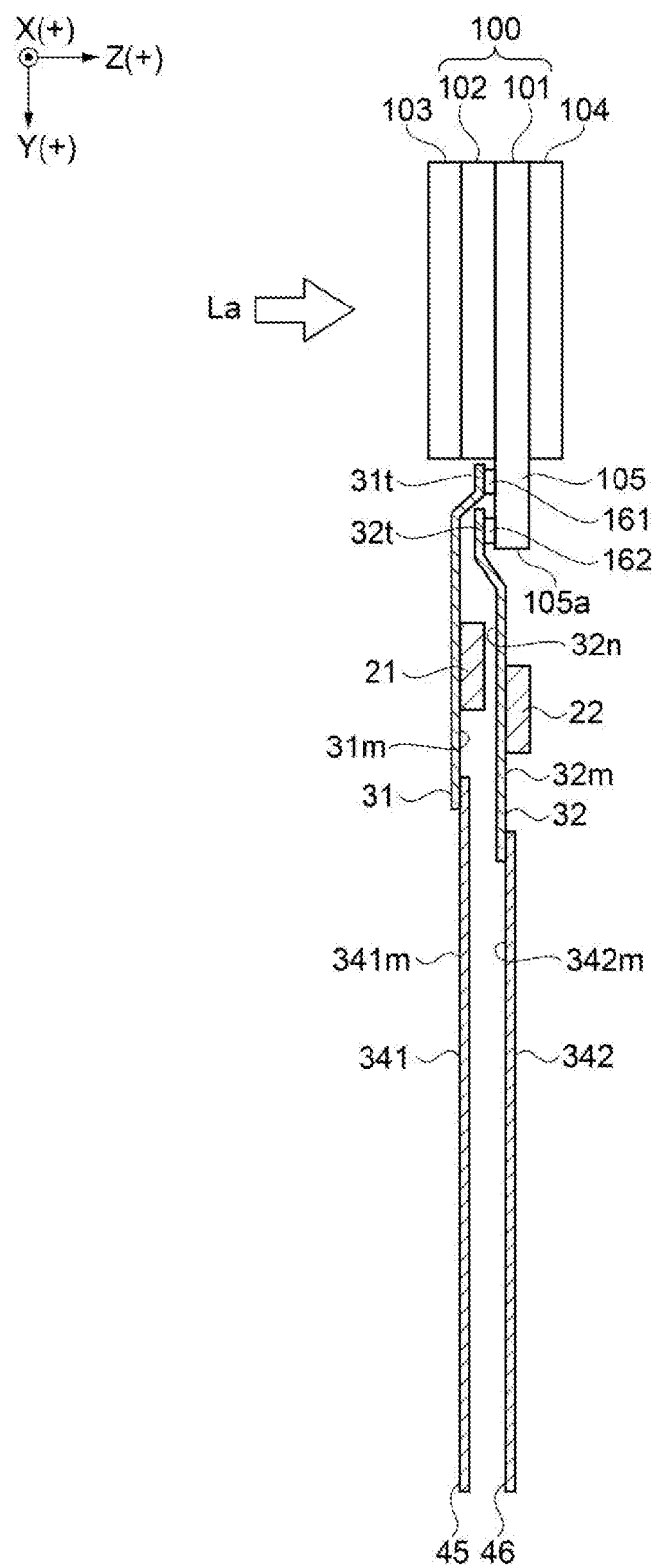
FIG. 4 is a side view illustrating the liquid crystal panel in which the first wiring substrate and the second wiring substrate are electrically coupled.

Now, a configuration of the liquid crystal apparatus according to the embodiment will be described with reference to FIG. 1, FIG. 2, FIG. 3, and FIG. 4. FIG. 1 is a perspective view illustrating a visual appearance of an electro-optical device according to a first embodiment. FIG. 2 is an exploded perspective view illustrating a configuration of the liquid crystal apparatus. FIG. 3 is a plan view illustrating a liquid crystal panel in which a first wiring substrate and a second wiring substrate are electrically coupled. FIG. 4 is a side view illustrating the liquid crystal panel in which the first wiring substrate and the second wiring substrate are electrically coupled.

As illustrated in FIG. 1, a liquid crystal apparatus 1 as an electro-optical device according to the present embodiment includes a liquid crystal panel 100 serving as an electro-optical panel, a first mounting substrate 351 and a second mounting substrate 352 electrically coupled to the liquid crystal panel 100, and a frame-shaped holder 70 holding the liquid crystal panel 100. The holder 70 includes a first holder member 71 and a second holder member 72 formed using, for example, a metal such as aluminum or an alloy.

Here, in the following description, a straight line along one side of the liquid crystal panel 100 is defined as the X axis, a straight line along another side intersecting with the straight line is defined as the Y axis, and a straight line along an advancing direction of light La incident on the liquid crystal panel 100 is defined as the Z axis. In the XYZ axis display in FIG. 1, the direction in which the arrow of the X axis faces is defined as a +X direction, the direction in which the arrow of the Y axis faces is defined as a +Y direction, the direction in which the arrow of the Z axis faces is defined as a +Z direction, and the direction opposite to each +direction is defined to as the corresponding −direction. At this time, the advancing direction of the light La corresponds to the +Z direction. Furthermore, viewing from the −z direction is referred to as "plan view". Additionally, the −Z direction is also referred to as "upper" and "+Z direction" is referred to as "downward".

The first mounting substrate 351 and the second mounting substrate 352 protrude from the holder 70 in the +Y direction and are electrically coupled to an external circuit not illustrated. Details of the first mounting substrate 351 and the second mounting substrate 352 will be described below.

As illustrated in FIG. 2, the liquid crystal panel 100 is transparent, and includes, for example, an element substrate 101 and a counter substrate 102 formed from light-transmitting substrates such as quartz substrates and disposed opposing each other, a liquid crystal layer interposed between the pair of substrates, and a display region 110. The counter substrate 102 is disposed on a light La incident side, that is, on a −Z direction side, with respect to the element substrate 101. The liquid crystal panel 100 includes a plurality of pixels 111 arranged in a matrix in the +X direction and the +Y direction. The display region 110 is a region in which the plurality of pixels 111 are arranged in a matrix. Note that the display region 110 may include dummy pixels that do not contribute to display of the liquid crystal panel 100.

A first dust resistant substrate 103 is disposed on the light La incident side of the counter substrate 102. A second dust resistant substrate 104 is disposed on a side of the liquid crystal panel 100 from which the light La incident on the liquid crystal panel 100 is emitted, after modulation, from the element substrate 101 as display light. The first dust resistant substrate 103 and the second dust resistant substrate 104 function to reduce the effect of foreign material on the liquid crystal panel 100 when the display light from the liquid crystal panel 100 is enlarged and projected. As the first dust resistant substrate 103 and the second dust resistant substrate 104, light-transmitting substrates, for example, quartz substrates, similar to the element substrate 101 and the counter substrate 102, are used in consideration of dimensional changes caused by expansion and contraction resulting from changes in temperature.

In the element substrate 101, a terminal portion 105 is a portion protruding in the +Y direction from the counter substrate 102 of the liquid crystal panel 100. The terminal portion 105 is provided with a first terminal group 161 and a second terminal group 162 for external coupling. The first terminal group 161 and the second terminal group 162 are provided at distances from an end portion 105a in the −Y direction. The second terminal group 162 is disposed closer to the end portion 105a than the first terminal group 161.

The first terminal group 161 includes a plurality of terminals arranged at a predetermined pitch along the −X direction. The second terminal group 162 includes a plurality of terminals arranged at a predetermined pitch along the −X direction. The first terminal group 161 is disposed between the second terminal group 162 and the display region 110.

The first mounting substrate 351 includes a first wiring substrate 31 on which a first driving IC 21 is mounted as a first driving element, and a first extension substrate 341 electrically coupled to the first wiring substrate 31. The second mounting substrate 352 includes a second wiring substrate 32 on which a second driving IC 22 is mounted as a second driving element, and a second extension substrate 342 electrically coupled to the second wiring substrate 32. The second wiring substrate 32 is disposed to overlap the first wiring substrate 31 in the +Z direction. The second wiring substrate 32 is positioned on the +Z direction side with respect to the first wiring substrate 31. Flexible Printed Circuits (FPCs), for example, are employed for the first wiring substrate 31 and the second wiring substrate 32.

The first wiring substrate 31 is electrically coupled to the first terminal group 161. The second wiring substrate 32 is electrically coupled to the second terminal group 162.

The first holder member 71 of the holder 70 includes a rectangular main body 71a and a first heat dissipation unit 73. The first heat dissipation unit 73 is provided with a plurality of heat dissipating fins 730 in the +Z direction. A rectangular opening 712 is provided in a part of the main body 71a corresponding to the display region 110 of the liquid crystal panel 100. Holes 711 are formed in the respective four corners of the main body 71a.

A second holder member 72 of the holder 70 includes a rectangular main body 72a and a second heat dissipation unit 74. The second heat dissipation unit 74 is provided with a plurality of heat dissipating fins 740 in the −Z direction. A rectangular opening 722 is provided in a part of the main body 72a corresponding to the display region 110 of the liquid crystal panel 100. Holes 721 are provided in the respective four corners of the main body 72a.

The second holder member 72 is provided with concave recessed portions not illustrated, on the +Z direction side. In other words, the recessed portion of the second holder member 72 accommodates the liquid crystal panel 100 to which the first dust resistant substrate 103 and the second dust resistant substrate 104 are attached, and the first holder member 71 holds the liquid crystal panel 100 in such a manner as to cover the first holder member 71 from the +Z direction side. The main body 71a of the first holder member 71 and the main body 72a of the second holder member 72 are fastened by for example, by inserting bolts into the holes 711 and 721 in the four corners.

A +X direction side surface and a −X direction side surface of the second heat dissipation unit 74 are each provided with a locking portion 74a on which a fixing member 75 is detachably locked. With the first mounting substrate 351 and the second mounting substrate 352 interposed between the first heat dissipation unit 73 and the second heat dissipation unit 74, the first heat dissipation unit 73 is fixed to the second heat dissipation unit 74 by the fixing member 75.

In this regard, in the present embodiment, the liquid crystal apparatus 1 including the holder 70 is described as an example of an electro-optical device. However, the holder 70 is not an essential component in the electro-optical device.

As illustrated in FIG. 3, the liquid crystal panel 100 includes a plurality of pixels 111 arranged in a matrix in the +X direction corresponding to a row direction and the +Y direction corresponding to a column direction, in the display region 110. The liquid crystal panel 100 is of an active drive type. Although not illustrated in the drawings, each of the pixels 111 is provided with pixel electrodes, switching elements, counter electrodes, and retention capacitors that correspond to one another. The switching elements controllably switch the pixel electrodes. The counter electrodes oppose the pixel electrodes via the liquid crystal layer. The pixel electrodes, the switching elements, and the holding capacitors are provided on the element substrate 101. The switching elements are, for example, thin film transistors (TFTs). The counter electrodes are provided on the counter substrate 102 at least across the display region 110 and opposite to a plurality of the pixel electrodes. The pixel electrodes and the counter electrodes are formed using transparent electrically conducting films, for example, indium tin oxide (ITO) or indium zinc oxide (IZO).

The terminal portion 105 of the element substrate 101 is provided with the first terminal group 161 and the second terminal group 162. In plan view, the first terminal group 161 and the second terminal group 162 are substantially equal in length along the −X direction. The first terminal group 161 and the second terminal group 162 are disposed such that both ends in the ±X directions are aligned between the first terminal group 161 and the second terminal group 162.

The first wiring substrate 31 of the first mounting substrate 351 is electrically coupled to the first terminal group 161. The first extension substrate 341 is electrically coupled to the first wiring substrate 31. The first extension substrate 341 includes a +Y direction end portion bent in the +X direction. The second wiring substrate 32 of the second mounting substrate 352 is electrically coupled to the second terminal group 162. The second extension substrate 342 is electrically coupled to the second wiring substrate 32. The second extension substrate 342 includes a +Y direction end portion bent in the −X direction.

The first extension substrate 341 is provided with a first input terminal 45 at a +Y direction end portion of the first extension substrate 341. The second extension substrate 342 is provided with a second input terminal 46 at a +Y direction end portion of the second extension substrate 342. In plan view, the first input terminal 45 and the second input terminal 46 are linearly arranged in juxtaposition along the −X direction. Such an arrangement of the first input terminal 45 and the second input terminal 46 allows electric coupling of the first input terminal 45 to one of two connectors placed flatly on the external circuit board, with the second input terminal 46 electrically coupled to the other connector. In other words, when the first extension substrate 341 is electrically coupled to the one of the connectors, the second extension substrate 342 does not disturb the coupling. Note that the first extension substrate 341 and the second extension substrate 342 are not limited to the configuration in which the first and second extension substrates 341 and 342 are bent in shape, but may have a linear shape along the +Y direction.

As illustrated in FIG. 4, the first driving IC 21 is mounted on a first substrate surface 31m of the first wiring substrate 31. A coupling terminal group 31t is provided at a −Y direction end portion of the substrate surface 31m. A second driving IC 22 is mounted on a first substrate surface 32m of the second wiring substrate 32. A coupling terminal group 32t is provided on a −Y direction end portion of the substrate surface 32m. In the present embodiment, the first wiring substrate 31 and the second wiring substrate 32 are both flexible single-sided wiring substrates.

On the terminal portion 105 of the element substrate 101 flaring from the counter substrate 102 in the +Y direction, the second terminal group 162 and the first terminal group 161 are provided in this order at a distance from the end portion 105a of the terminal portion 105. The first terminal group 161 and the coupling terminal group 31t of the first wiring substrate 31 are electrically coupled, for example, via an Anisotropic Conductive Film (ACF). Similarly, the second terminal group 162 and the coupling terminal group 32t of the second wiring substrate 32 are electrically coupled, for example, via an ACF.

The first wiring substrate 31 is mounted to the terminal portion 105 of the element substrate 101 so as to overlap the previously mounted second wiring substrate 32 in the −Z direction. Additionally, the first wiring substrate 31 is mounted to the terminal portion 105 offset from the second wiring substrate 32 in the −Y direction in accordance with the arrangement of the first terminal group 161 and the second terminal group 162 in the terminal portion 105. Thus, when the first wiring substrate 31 and the second wiring substrate 32 are mounted to the terminal portion 105, a second substrate surface 32n of the second wiring substrate 32 and the first substrate surface 31m of the first wiring substrate 31 face each other in the ±Z direction.

The first extension substrate 341 and the second extension substrate 342 are also flexible single-sided wiring substrates. A first input terminal 45 is provided at a +Y direction end portion of a first substrate surface 341m of the first extension substrate 341, and a coupling terminal not illustrated is provided at a −Y direction end portion of the first substrate surface 341m. The first extension substrate 341 is electrically coupled to the first wiring substrate 31 via the coupling terminal.

A second input terminal 46 is provided at a +Y direction end portion of a first substrate surface 342m of the second extension substrate 342, and a coupling terminal not illustrated is provided at a −Y direction end portion of the first substrate surface 342m. The second extension substrate 342 is electrically coupled to the second wiring substrate 32 via the coupling terminal.

Although not illustrated, the first substrate surface 31m of the first wiring substrate 31 is provided with a plurality of pieces of wiring and a resist layer or a coverlay covering the plurality of pieces of wiring. Similarly, the first substrate surface 32m of the second wiring substrate 32 is provided with a plurality of pieces of wiring and a resist layer or a coverlay covering the plurality of pieces of wiring. Each of the first extension substrate 341 and the second extension substrate 342 is provided with a plurality of wirings and a resist layer or a coverlay covering the plurality of wiring.

Although omitted from the drawings, the first driving IC 21 is a bare chip and is mounted on the first wiring substrate 31 with an outer periphery of the first driving IC 21 molded. The second driving IC 22 is also a bare chip, and is mounted on the second wiring substrate 32 with an outer periphery of the second driving IC 22 molded.

In this case, in the terminal portion 105, it is desirable to ensure coupling reliability between the first terminal group 161 and the coupling terminal group 31t and coupling reliability between the second terminal group 162 and the coupling terminal group 32t. Thus, a region of the terminal portion 105 on which the first wiring substrate 31 and the second wiring substrate 32 are mounted may be sealed using a mold material having insulating properties. Note that, besides the first driving IC 21, other electronic components, for example, chip resistors or chip capacitors, may be mounted on the first wiring substrate 31. Besides the second driving IC 22, other electronic components may be mounted on the second wiring substrate 32.

1.2. Electrical Configuration of Liquid Crystal Apparatus

Figure 5:
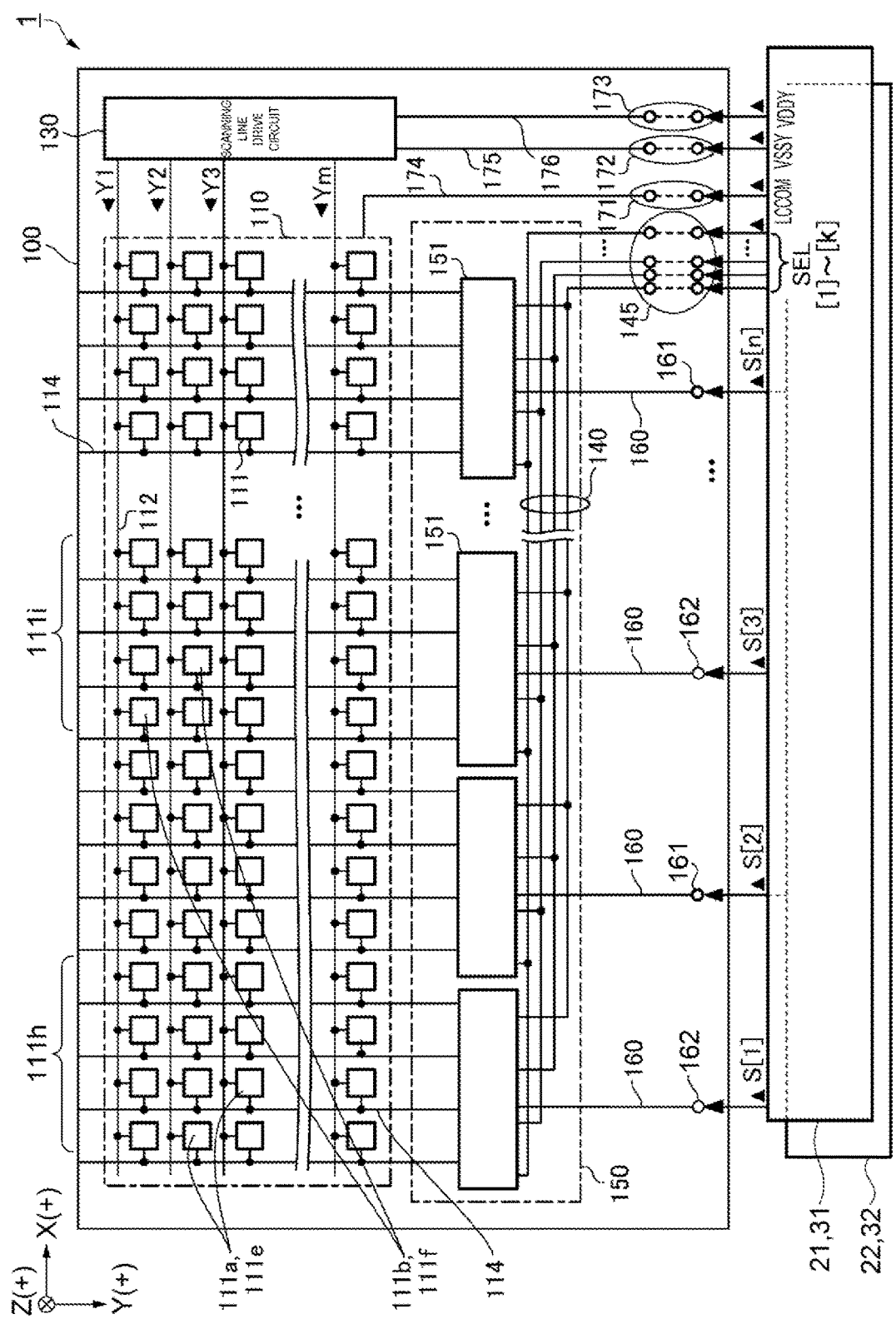
FIG. 5 is a circuit diagram illustrating an electrical configuration of the liquid crystal apparatus.

Now, an electrical configuration of the liquid crystal apparatus 1 will be described with reference to FIG. 5. FIG. 5 is a circuit diagram illustrating an electrical configuration of the liquid crystal apparatus.

As illustrated in FIG. 5, the liquid crystal panel 100 of the liquid crystal apparatus 1 includes the display region 110, a scanning line drive circuit 130, a data line selection circuit 150, n image signal lines 160, and a first terminal group 161 and a second terminal group 162 including n image signal input terminals, k selection signal lines 140, k selection signal input terminals 145, a plurality of power supply terminals 171, 172, and 173, and power supply lines 174, 175, and 176 corresponding to the power supply terminals 171, 172, 173. n is an integer equal to or greater than 1, and k is an integer equal to or greater than 2.

The above-described elements are provided on the element substrate 101 shown in FIG. 2. On the element substrate 101, the data line selection circuit 150 is provided along the +X direction between the display region 110 and the first terminal group 161 and the second terminal group 162, and the scanning line drive circuit 130 is provided along the +Y direction between the display region 110 and a side of the element substrate 101 intersecting with the side provided with the data line selection circuit 150.

Clock signals, control signals, image data, and the like from an external upper circuit not illustrated are input to the first driving IC 21 and the second driving IC 22 via the first extension substrate 341 and the second extension substrate 342 illustrated in FIG. 4. The first driving IC 21 and the second driving IC 22 output image signals, control signals, and the like indicating images to be displayed on the liquid crystal panel 100 in accordance with the clock signals, control signals, image data, and the like. The liquid crystal panel 100 displays images based on the clock signals and image signals input from the first driving IC 21 and the second driving IC 22.

The display region 110 is provided with m scanning lines 112, (k×n) the data lines 114, and (m×k×n) pixels 111. "m" represents an integer of 1 or greater. The pixels 111 are provided corresponding to intersections between the scanning lines 112 and the data lines 114, and are arranged in a matrix of m rows×(k×n) columns. The scanning lines 112 are signal lines transmitting scanning signals Y1, Y2, Y3, . . . , Ym. The scanning lines 112 are provided along the −X direction from the scanning line drive circuit 130. Data lines 114 transmit data signals. The data lines 114 are provided along the −Y direction from the data line selection circuit 150.

In the display region 110, k×m pixels 111 corresponding to k data lines 114 form a block corresponding to a single pixel group. For example, a first pixel group 111h and a second pixel group 111*i* are provided. In the first pixel group 111*h*, k first pixel rows 111*e* including first pixels 111*a* are arranged. In the second pixel group 111*i*, k second pixel rows 111*f* including second pixels 111*b* are arranged.

In this case, the pixels 111 belonging to the same pixel group correspond to the same image signal line 160 via the data line selection circuit 150. Accordingly, the liquid crystal panel 100 includes n blocks into which n pixel groups are divided by n image signal lines 160 or the first terminal groups 161 and the second terminal groups 162 corresponding to n image signal input terminals.

The scanning line drive circuit 130 selects, from a plurality of pixels 111, a row to which data is to be written. Specifically, the scanning line drive circuit 130 outputs a scanning signal for selecting one of the plurality of scanning lines 112. The scanning line drive circuit 130 supplies scan signals Y1, Y2, Y3, . . . , Ym to the first, second, . . . , m-th scan lines 112.

The data line selection circuit 150 selects, in each of the pixel groups, column pixels corresponding to a column of pixels 111 to which image signals are to be written. Specifically, the data line selection circuit 150 selects at least one data line 114 from the k data lines 114 belonging to the pixel group in accordance with selection signals SEL [1] to SEL [k]. Each of the data lines 114 corresponds to one of the image signal lines 160 through the data line selection circuit 150. In the present embodiment, the data line selection circuit 150 includes demultiplexers 151 corresponding to the respective pixel groups.

The image signal lines 160 electrically couple the first terminal groups 161 and the second terminal groups 162, corresponding to image signal input terminals, and the data line selection circuit 150. The image signal lines 160 are signal lines transmitting image signals S[1] to S[n] input from the first wiring substrate 31 and the second wiring substrate 32 to the data line selection circuit 150 via the image signal input terminals. n image signal lines 160 are provided corresponding to the respective n image signal input terminals or n pixel groups. Hereinafter, the image signals S[1] to S[n] are also simply referred to as the image signals S.

The image signals S are signals indicating data to be written to the pixels 111. One image signal line 160 is coupled to k data lines 114 via the data line selection circuit 150. Thus, in the image signal S, data to be fed to the k data lines 114 is time-division-multiplexed.

The selection signal lines 140 electrically couple the selection signal input terminals 145 and the demultiplexers 151 of the data line selection circuit 150. The selection signal lines 140[1] to 140[k] are signal lines transmitting selection signals SEL[1] to SEL [k] input from the selection signal input terminals 145[1] to 145[k], corresponding to the selection signal input terminals 145. k selection signal lines 140 are provided. Hereinafter, the selection signals SEL[1] to SEL[k] are also simply referred to as the selection signals SEL.

The image signal input terminals are terminals to which the first wiring substrate 31 and the second wiring substrate 32 are electrically coupled and to which image signals S[j] are fed. Here, j is an integer equal to or greater than 1 and equal to or smaller than n. In this example, image signals S[2*t*] are fed from the first driving IC 21 to the first terminal groups 161 that are image signal input terminals corresponding to the image signal lines 160 in even-numbered columns: the second column, the fourth column, the sixth column, . . . , the (2*t*)th column. Here, j is an integer equal to or greater than 1 and equal to or smaller than n/2.

Additionally, image signals S[2*t*−1] are fed from the second driving IC 22 to the second terminal groups 162 that are image signal input terminals corresponding to the image signal lines 160 in odd-numbered columns: the first column, the third column, the fifth column, . . . , the (2*t*−1)th column. The image signals S are what is called data signals, and the image signal input terminals are fed with analog signals with different waveforms corresponding to display of images.

The selection signal input terminals 145 are terminals electrically coupled to the first wiring substrate 31 and the second wiring substrate 32, and are fed with the selection signals SEL including pulse signals. Each of the selection signal input terminals 145 is fed with the selection signal SEL from both or one of the first driving IC 21 and the second driving IC 22.

In the present embodiment, selection signals SEL with the same waveforms are fed to the selection signal input terminals 145 corresponding to the first wiring substrate 31 and to the selection signal input terminals 145 corresponding to the second wiring substrate 32.

The power supply terminals 171, 172, and 173 are terminals electrically coupled to the first wiring substrate 31 and the second wiring substrate 32. The power supply terminals 171, 172, and 173 are fed with a power supply voltage from an upper circuit via the first wiring substrate 31 and the second wiring substrate 32 without passing through the first driving IC 21 and the second driving IC 22. The power supply voltage is a voltage used as a power supply in the liquid crystal panel 100, and in this example, is a DC voltage. The power supply terminal 171 is a terminal for supplying a common voltage LCCOM. The power supply terminal 172 is a terminal for supplying a reference voltage VSSY. The power supply terminal 173 is a terminal for supplying a drive voltage VDDY.

The common voltage LCCOM is a voltage used as a reference potential for a voltage applied to the liquid crystal layer of the liquid crystal panel 100. The reference voltage VSSY is a voltage used as a low-voltage-side power supply potential of the scanning line drive circuit 130. The drive voltage VDDY is a voltage used as a high-voltage-side power supply potential of the scanning line drive circuit 130.

In the present embodiment, the element substrate 101 is provided with the one scanning line drive circuit 130, and thus the power supply terminals 172 and 173 are provided on only one side in the +X direction. Note that the arrangement of the scanning line drive circuit 130 is not limited to this configuration.

In the present embodiment, in the image signals S[j], data to be written to the pixels 111 in the corresponding [k×j −k+1]th column to [k×j]th pixel groups is time-division-multiplexed. Additionally, when the image signal S[j] is an even-numbered signal S[2*t*], the image signal S[j] is fed from the first driving IC 21 to the data line 114 for the even-numbered pixel group. When the image signal S[j] is an odd-numbered signal S[2*t*−1], the image signal S[j] is fed from the second driving IC 22 to the data line 114 for the odd-numbered pixel group.

According to such a configuration, the use of the two drive units IC of the first driving IC 21 and the second driving IC 22 facilitates accommodation of an increase in the number of pixels in the liquid crystal panel 100. The arrangement of the first terminal groups 161 and the second terminal groups 162 enables implementation of a small, high-resolution and high-quality liquid crystal apparatus 1. Note that the electrical coupling between the data lines 114 for the pixel groups and the first terminal groups 161 and the second terminal groups 162 is not limited to the above-described configuration.

The liquid crystal apparatus 1 may check whether normal images are displayed by driving the liquid crystal panel 100 in accordance with various signals such as clock signals, control signals, image data, and the like input from the external circuit via the first mounting substrate 351 and the second mounting substrate 352. When an error occurs in display, which of the liquid crystal panel 100, the first mounting substrate 351, and the second mounting substrate 352 is the cause of the error needs to be determined. In particular, the first driving IC 21 is mounted on the first wiring substrate 31 of the first mounting substrate 351, and the second driving IC 22 is mounted on the second wiring substrate 32 of the second mounting substrate 352. Thus, it is important to check whether or not the output signal and power supply noise from the first driving IC 21 and the second driving IC 22 are normal.

As illustrated in FIG. 4, the first wiring substrate 31 and the second wiring substrate 32 are each a single-sided wiring substrate. The first wiring substrate 31 and the second wiring substrate 32 are mounted to the terminal portion 105 of the element substrate 101 in an overlapping manner. In this case, the first substrate surface 31m of the first wiring substrate 31 and the first substrate surface 32m of the second wiring substrate 32 are disposed facing the +Z direction. Since the second driving IC 22 is mounted on the substrate surface 32m, electrical coupling to the wiring coupled to a plurality of output terminals of the second driving IC 22 is easy. In contrast, the first wiring substrate 31 overlaps with the second wiring substrate 32 in the +Z direction. Since the first driving IC 21 is mounted on the substrate surface 31m, the second wiring substrate 32 disturbs electrical coupling to the wiring coupled to a plurality of output terminals of the first driving IC 21.

Thus, the inventors have contrived a configuration of the liquid crystal panel 100 that enables easy electrical coupling to the wiring coupled to the output terminals of the first driving IC 21 as well as the second driving IC 22 in spite of overlapping mounting of the first wiring substrate 31 and the second wiring substrate 32. A configuration related to mounting of the liquid crystal apparatus 1 will be described below with reference to the accompanying drawings.

1.3. Configuration Related to Mounting of Liquid Crystal Device

Figure 6:
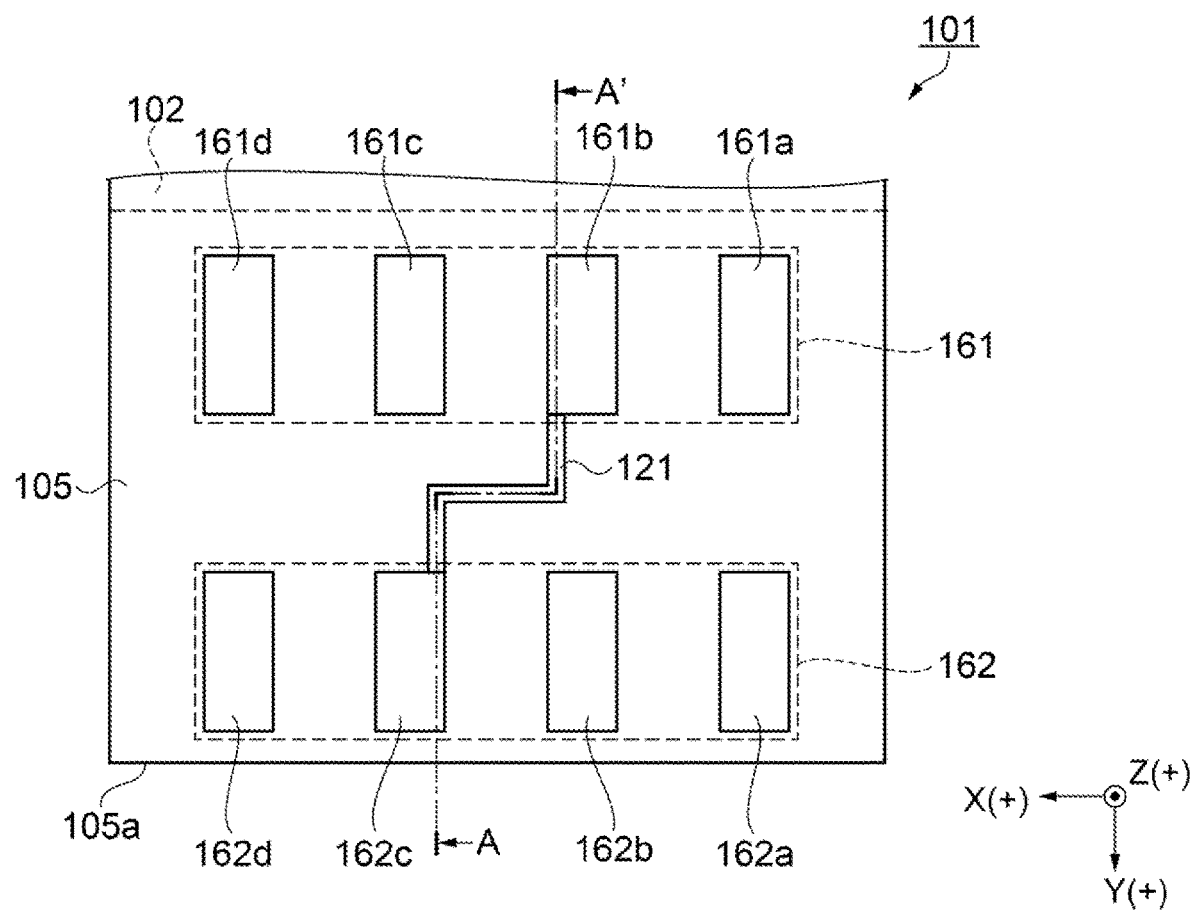
FIG. 6 is a schematic plan diagram illustrating an arrangement of a first terminal, a second terminal, and the like in the liquid crystal panel.
Figure 7:
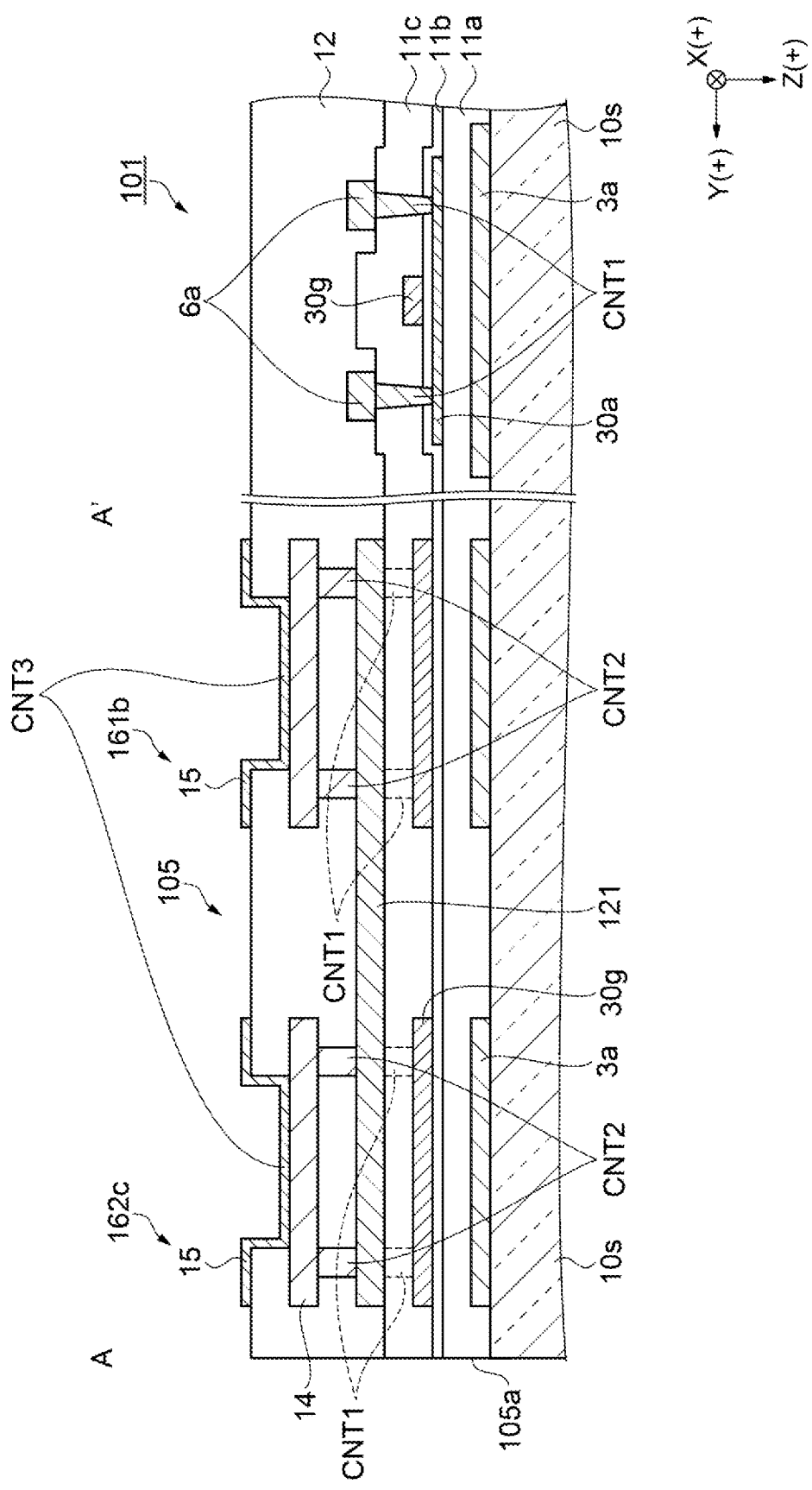
FIG. 7 is a schematic cross-sectional view of the liquid crystal panel illustrated in FIG. 6, the view being taken along line A-A' in FIG. 6.
Figure 8:
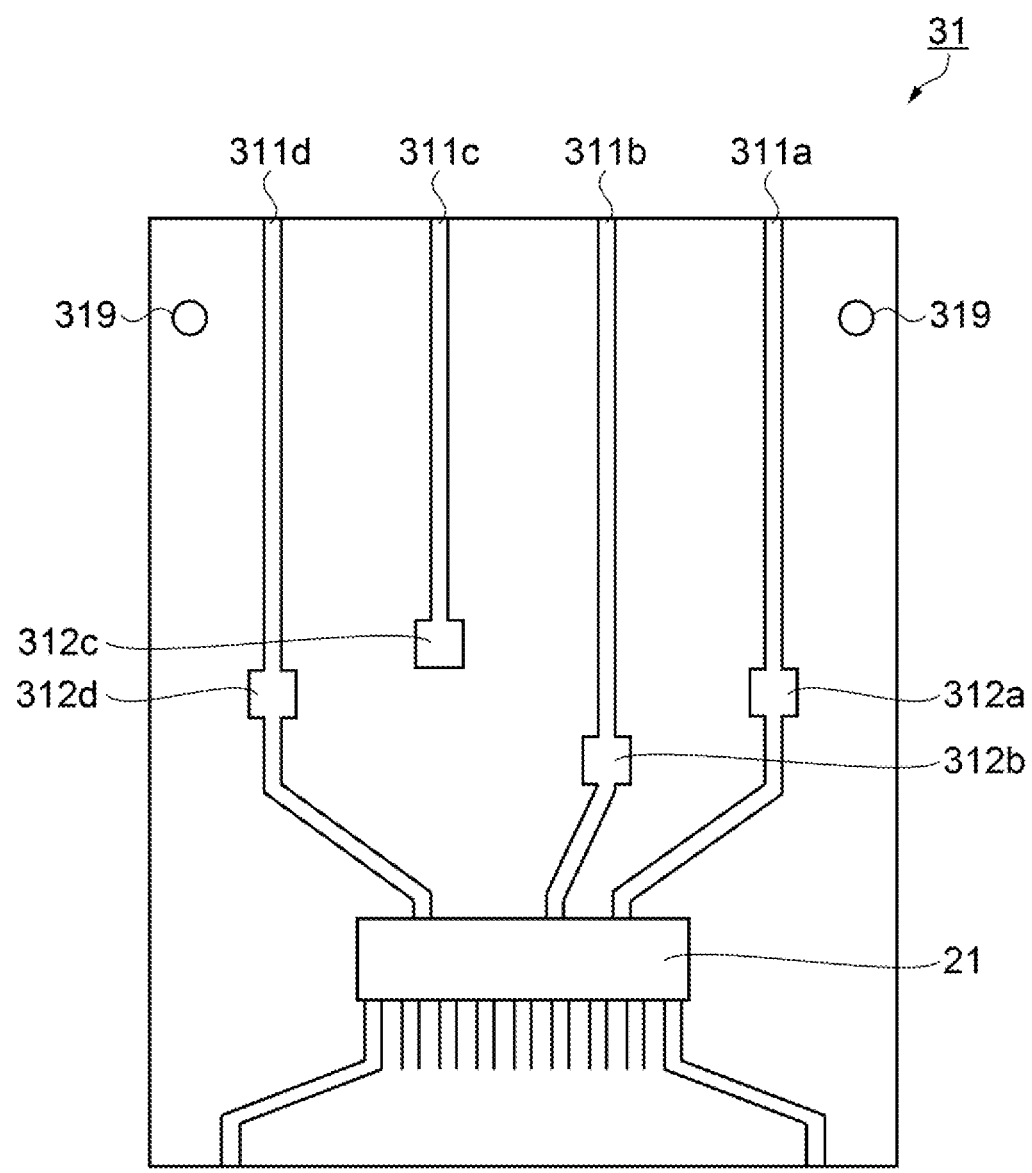
FIG. 8 is a schematic plan diagram illustrating a configuration of the first wiring substrate.
Figure 9:
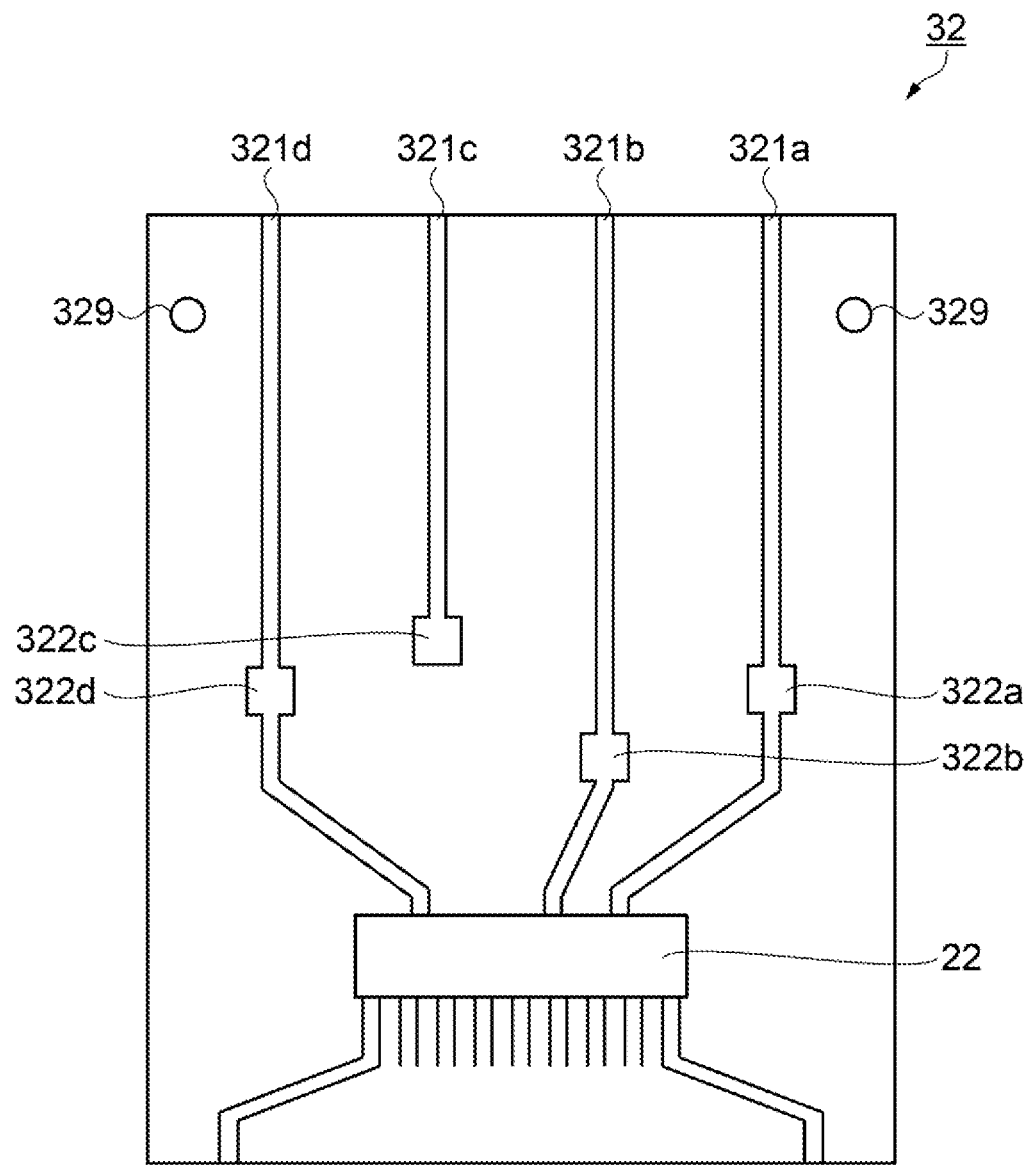
FIG. 9 is a schematic plan diagram illustrating a configuration of the second wiring substrate.
Figure 10:
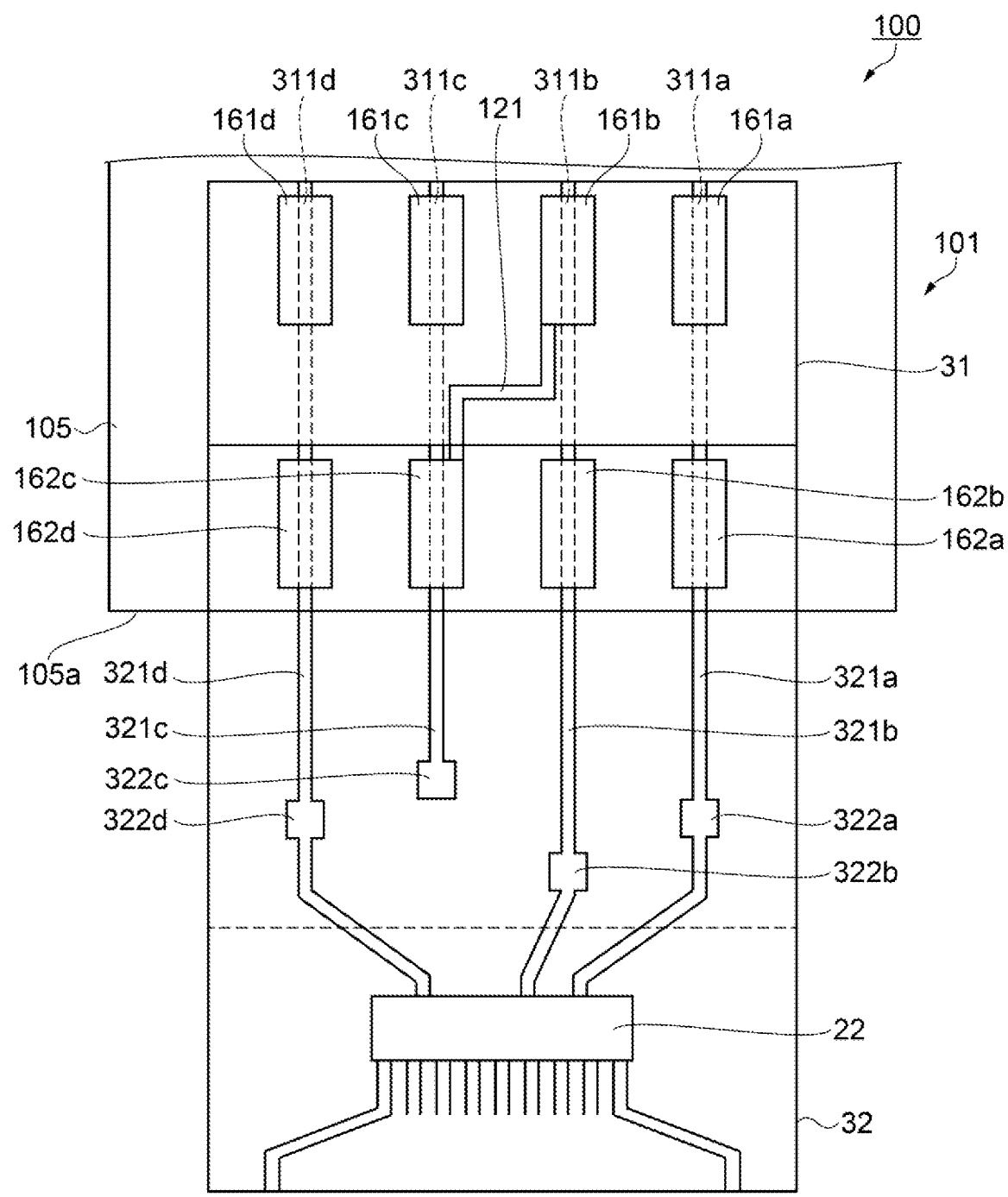
FIG. 10 is a schematic plan diagram illustrating a state in which the first wiring substrate and the second wiring substrate are mounted to a terminal portion.

FIG. 6 is a schematic plan diagram illustrating an arrangement of the first terminal, the second terminal, and the like in the liquid crystal panel. FIG. 7 is a schematic cross-sectional view of the liquid crystal panel illustrated in FIG. 6, the view being taken along line A-A'. FIG. 8 is a schematic plan diagram illustrating a configuration of the first wiring substrate. FIG. 9 is a schematic plan diagram illustrating a configuration of the second wiring substrate. FIG. 10 is a schematic plan diagram illustrating a state in which the first wiring substrate and the second wiring substrate are mounted to the terminal portion.

Note that FIGS. 6 to 8 and FIG. 10 are schematic diagrams in which the following are omitted: the terminals of the first terminal group 161 and the second terminal group 162, the wiring coupled to the terminals of the first terminal group 161 and the second terminal group 162, the wiring coupled to the input terminals of the first driving IC 21 and the second driving IC 22, and the like. Additionally, compared to FIG. 3 illustrating a state as viewed from the −Z direction, FIGS. 6 and 8 and FIG. 10 illustrate a state as viewed from the opposite, +Z direction, in other words, illustrate a surface on which various types of wiring and the like are provided. Furthermore, FIG. 6 and FIG. 10 transparently illustrate the first terminal group 161, the second terminal group 162, and a connecting portion.

As illustrated in FIG. 6, the terminal portion 105 protruding from the element substrate 101 in the +Y direction is provided with the first terminal group 161 and the second terminal group 162. The first terminal group 161 and the second terminal group 162 each include a plurality of substantially rectangular terminals arranged along the X direction and occupying an elongated region in the X direction. The first terminal group 161 includes terminals 161a, 161b, 161c, and 161d as a plurality of terminals. In this case, the terminal 161b is an example of the first terminal of the present invention. The second terminal group 162 has terminals 162a, 162b, 162c, and 162d as a plurality of terminals. In this case, the terminal 162c is an example of the second terminal of the present invention.

The first terminal group 161 and the second terminal group 162 are equal in length along the −X direction and the +Y direction. The second terminal group 162 is positioned near the end portion 105a, and the first terminal group 161 is positioned on the −Y direction side of the second terminal group 162.

The element substrate 101 of the liquid crystal panel 100 includes a connecting portion 121. The connecting portion 121 electrically couples the terminal 161b of the first terminal group 161 and the terminal 162c of the second terminal group 162.

As illustrated in FIG. 7, in the element substrate 101 of the liquid crystal panel 100, a plurality of layers are provided above the substrate 10s. In this case, FIG. 7 illustrates a region including a thin film transistor (hereinafter abbreviated as a "TFT") serving as switching elements, as well as a region including the terminals 161b and 162c.

First, a configuration of the layer of the region including the TFT will be described. A light shielding layer 3a is provided on the substrate 10s. A first interlayer insulating film 11a is provided covering the light shielding layer 3a, and a semiconductor layer 30a of the TFT is provided covering the first interlayer insulating film 11a. The semiconductor layer 30a is disposed on the first interlayer insulating film 11a in an island shape.

A gate insulating film 11b is provided covering the semiconductor layer 30a. Furthermore, a gate electrode layer 30g is provided at a position opposite the channel region of the semiconductor layer 30a in the ±Z direction via the gate insulating film 11b.

A second interlayer insulating film 11d is formed covering the gate electrode layer 30g and the gate insulating film 11c. Two contact holes CNT1 penetrating through the gate insulating film 11b and the second interlayer insulating film 11c are formed at positions overlapping the end portions in the ±Y direction of the semiconductor layer 30a.

A first wiring layer 6a covering a part of the second interlayer insulating film 11c is provided via the contact hole CNT1. The first wiring layer 6a is electrically coupled to a data line side source drain region (not illustrated).

A third interlayer insulating film 12 is provided covering the first wiring layer 6a and the second interlayer insulating film 11c. Although not illustrated in the drawings, a plurality of wiring layers, capacitance electrodes, pixel electrodes, and the like are provided above the semiconductor layer 30a described above. In addition, the element substrate 101 includes a layer forming a retention capacitor for the pixels 111. However, the layer is unnecessary for the description of the present embodiment, and description of the layer is omitted.

Now, the region including the terminals 161b and 162c will be described. The region has the same layer configuration as that of the region including the TFT described above. Terminal 161b and 162c made of a wiring layer 15 is provided on an upper surface of the terminal portion 105. The wiring layer 15 is formed of the same layer as that of the pixel electrode. In each of the terminals 161b and 162c, the wiring layer 15 is electrically coupled to the second wiring layer 14 via a contact hole CNT3. The second wiring layer 14 is formed of the same layer as that of any of the plurality of wiring layers provided above the semiconductor layer 30a described above. The terminal 161b is an effective terminal to which drive signals for the liquid crystal panel 100 and voltages are input, and the terminal 162c is a dummy terminal that can be used to check output signals and power supply noise.

The second wiring layer 14 to which the terminal 161b couples is electrically coupled to the connecting portion 121 via a contact hole CNT2. The second wiring layer 14 to which the terminal 162c couples is electrically coupled to the connecting portion 121 via the contact hole CNT2. Specifically, the connecting portion 121 is provided in a layer below the wiring layer 15 of the layer provided with the terminals 161b and 162c, in other words, in the layer below in the +Z direction.

The connecting portion 121 is electrically conductive, and thus the terminal 161b and the terminal 162c are electrically coupled. The connecting portion 121 is formed of the same layer as that of the first wiring layer 6a. The connecting portion 121, like the first wiring layer 6a, for example, is formed by forming a conductive film of a metal having a light shielding property such as Al (aluminum) or an alloy thereof, and then patterning the conductive film. Note that the terminals 161b and 162c may be coupled using the gate electrode layer 30g and the contact hole CNT1, and the connecting portion 121 may be formed using the gate electrode layer 30g. The gate electrode layer 30g is formed of WSi or the like having a resistance value greater than Al (aluminum), and thus a resistor of approximately kΩ can be formed in the connecting portion 121. In this case, instead of being formed like a linear coupling line, the connecting portion 121 may be formed like, for example, a coupling line with a large number of bent shapes to ensures an appropriate resistance value. The connecting portion functions as a protective resistor in a case of probing of a monitoring pad described below, and can thus suppress electrostatic breakdown of the liquid crystal panel 100 and the first driving IC 21.

The configuration of the layers below the connecting portion 121 is the same as the region including TFT, and thus descriptions of these layers will be omitted. Note that in the present embodiment, the configuration has been illustrated in which the same layer as the first wiring layer 6a is used as the connecting portion 121. However, the present embodiment is not limited to this configuration. It is sufficient that the connecting portion 121 is provided in a layer below the terminals 161b and 162c, in other words, below the wiring layer 15, and that, for example, the second wiring layer 14 may be coupled to the terminals 161b and 162c in the ±Y direction to form a connecting portion.

As illustrated in FIG. 8, the first wiring substrate 31 has a rectangular outer shape, and the first driving IC 21 is mounted closer to a lower end of the first wiring substrate 31 with respect to the center in the +Y direction. The first wiring substrate 31 includes coupling wiring 311a, 311b, 311c, and 311d and monitoring pads 312a, 312b, 312c, 312d serving as a monitor unit. The three monitoring pads 312a, 312b, and 312d are electrically coupled to −Y direction side output terminals of the first driving IC 21; the output terminals are not illustrated. The monitoring pad 312c is not electrically coupled to the first driving IC 21. Note that the first wiring substrate 31 is electrically coupled to the first terminal group 161 on the −Y direction side.

Although not illustrated, the first driving IC 21 includes a plurality of input terminals and a plurality of output terminals. The first driving IC 21 has a substantially rectangular shape, and includes a plurality of input terminals disposed on a +Y direction side the +Y direction side and the −Y direction side, one of the opposing sides in the ±Y directions, and a plurality of output terminals disposed on a −Y direction side, the other side in the ±Y directions. The plurality of input terminals and the plurality of output terminals are provided on a mounting surface of the first driving IC 21 on the first wiring substrate 31. In other words, the input terminals and the output terminals are provided on an active surface of the first driving IC 21, which is a bare chip. Various signals and various types of power supply voltages are input to the plurality of input terminals. Various signals are output from the plurality of output terminals.

In this case, a plurality of pieces of wiring of the first wiring substrate 31 that are not electrically coupled to the first driving IC 21 and that are not illustrated are fed with any of a common voltage LCCOM, a reference voltage VSSY, and a drive voltage VDDY, which are power supply voltages illustrated in FIG. 5.

When the first wiring substrate 31 is mounted to the terminal portion 105, terminal alignment marks 319 on the first wiring substrate 31 may be used for relative alignment in the +X direction and the +Y relative to the first terminal group 161 on the terminal portion 105.

The monitoring pad 312c is provided closer to the −Y direction side than the three other monitoring pads 312a, 312b, and 312d. Thus, the coupling wiring 311c for the monitoring pad 312c, extending from the −Y direction end portion of the first wiring substrate 31, is shorter than the coupling wiring for the other monitoring pads. The monitoring pads 312a, 312b, 312c, and 312d have, for example, a size with which the monitoring pads 312a, 312b, 312c, and 312d are visible enough with the help of a loupe or the like in plan view.

As illustrated in FIG. 9, the second wiring substrate 32 has the same design as that of the first wiring substrate 31 in terms of shape and size. In other words, the second wiring substrate 32 includes coupling wiring, four monitoring pads serving as a monitor unit, and the like, as well as the second driving IC 22 mounted on the second wiring substrate 32.

Specifically, the second wiring substrate 32 has a rectangular outer shape, and the second driving IC 22 is mounted closer to a lower end of the second wiring substrate 32 with respect to the center in the +Y direction. The second wiring substrate 32 includes coupling wiring 321a, 321b, 321c, and 321d and monitoring pads 322a, 322b, 322c, and 322d serving as a monitor unit. The three monitoring pads 322a, 322b, and 322d are electrically coupled to −Y direction side output terminals of the second driving IC 22; the output terminals are not illustrated. The monitoring pad 322c is not electrically coupled to the second driving IC 22. Note that the second wiring substrate 32 is electrically coupled to the second terminal group 162 on the −Y direction side.

Although not illustrated, the second driving IC 22 includes a plurality of input terminals and a plurality of output terminals. The second driving IC 22 has a substantially rectangular shape, and includes a plurality of input terminals disposed on a +Y direction side, one of the opposing sides in the ±Y directions, and a plurality of output terminals disposed on a −Y direction side, the other side in the ±Y directions. The plurality of input terminals and the plurality of output terminals are provided on a mounting surface of the second driving IC 22 in the second wiring substrate 32. Specifically, the input terminals and the output terminals are provided on an active surface of a second driving IC 22, which is a bare chip. Various signals and various types of power supply voltages are input to the plurality of input terminals. Various signals are output from the plurality of output terminals.

In this case, a plurality of pieces of wiring of the second wiring substrate 32 that are not electrically coupled to the second driving IC 22 and that are not illustrated are fed with any of the common voltage LCCOM, the reference voltage VSSY, and the drive voltage VDDY, which are the power supply voltages illustrated in FIG. 5.

When the second wiring substrate 32 is mounted to the terminal portion 105, terminal matching marks 329 on the second wiring substrate 32 may be used for relative alignment in the +X direction and the +Y direction relative to the second terminal group 162 on the terminal portion 105.

The monitoring pad 322c is provided closer to a −Y direction side than the three other monitoring pads 322a, 322b, and 322d. Thus, the coupling wiring 321c for the monitoring pad 322c, extending from the −Y direction end portion of the second wiring substrate 32, is shorter than the coupling wiring for the other monitoring pads. The monitoring pads 322a, 322b, 322c, and 322d have, for example, a size with which the monitoring pads 322a, 322b, 322c, and 322d are visible enough with the help of a loupe or the like in plan view. The first wiring substrate 31 and the second wiring substrate 32 have a common configuration as described above, thus facilitating a reduction in costs of the first wiring substrate 31 and the second wiring substrate 32. Note that the second wiring substrate 32 is not limited to the same design as that of the first wiring substrate 31 but may be in a form different from that of the first wiring substrate 31.

For the monitoring pads 322a, 322b, 322c, and 322d, resist may be removed in advance from corresponding portions of the second wiring substrate 32. Alternatively, a second wiring substrate 32 covered with resist may be formed, the resist may be rubbed off with forceps or the like as necessary, and signals may be measured. Each of the monitoring pads may be shaped by being formed at a wiring tip protruding from the wiring instead of increasing the width of the wiring as in the working example. In this manner, the monitoring pads can take various forms and may be used as a monitor unit. Furthermore, the monitoring pads may take a form in which the monitoring pads are provided on power supply wiring to the liquid crystal panel 100.

As illustrated in FIG. 10, when the first wiring substrate 31 and the second wiring substrate 32 are mounted to the terminal portion 105 in an overlapping manner, the second wiring substrate 32 is positioned on the +Z direction side of the first wiring substrate 31. Thus, the monitoring pads 322a, 322b, 322c, and 322d of the second wiring substrate 32 are exposed to the +Z direction side, while the monitoring pads 312a, 312b, 312c, and 312d of the first wiring substrate 31 are hidden by the second wiring substrate 32, leading to difficulty in bringing an inspection probe into contact with the monitoring pads 312a, 312b, 312c, and 312d.

Thus, the monitoring pad 322c of the second wiring substrate 32 is used to check the first driving IC 21 for output signals and power supply noise. Specifically, as illustrated in FIG. 8, the coupling wiring 311b of the first wiring substrate 31 is electrically coupled to the output terminal of the first driving IC 21. The coupling wiring 311b is electrically coupled to the terminal 161b as the first terminal. In other words, the first driving IC 21 and the terminal 161b are electrically coupled.

The terminal 161b of the first terminal group 161 is electrically coupled to the terminal 162c of the second terminal group 162 via the connecting portion 121. The terminal 162c is electrically coupled to the monitoring pad 322c via the coupling wiring 321c of the second wiring substrate 32. The monitoring pad 322c is not electrically coupled to the second driving IC 22 mounted on the second wiring substrate 32. According to the configuration described above, the first driving IC 21 on the first wiring substrate 31 can be easily checked for output signals and power supply noise using the monitoring pad 322c of the second wiring substrate 32.

The monitoring pad 322c is disposed closer to the second terminal group 162 than the monitoring pads 322a, 322b, and 322d, which correspond to other monitor unit electrically coupled to the second driving IC 22. Thus, the coupling wiring 321c from the −Y direction end portion of the second wiring substrate 32 is smaller in length than the other coupling wiring. Note that, in the above-described configuration, the terminal 161c of the first terminal group 161 is not electrically coupled to the first driving IC 21, and thus serves as a dummy terminal.

As described above, the liquid crystal apparatus 1 as the electro-optical device according to the present embodiment can provide the following advantages.

Output signals and power supply noise from the first driving IC 21 on the first wiring substrate 31 can be checked more easily than in the related art. Specifically, the liquid crystal apparatus 1 is provided with the first terminal group 161 and the second terminal group 162 in order to support an increased resolution of pixels. The first wiring substrate 31 and the second wiring substrate 32 are respectively electrically coupled to the first terminal group 161 and the second terminal group 162, and the second wiring substrate 32 is disposed overlapping the first wiring substrate 31. The terminal 161b of the first terminal group 161 corresponding to the first terminal is electrically coupled to the monitoring pad 322c of the second wiring substrate 32 via the terminal 162c of the second terminal group 162 corresponding to the second terminal. Thus, even when the wiring of the first wiring substrate 31 is present on the inner side of the first wiring substrate 31 and the second wiring substrate 32, disposed in an overlapping manner, the monitoring pad 322c can be used to check the first driving IC 21 for output signals and power supply noise. Accordingly, the liquid crystal apparatus 1 can be provided that facilitates checks on output signals from the wiring substrates.

The terminal 162c electrically coupled to the monitoring pad 322c is also not electrically coupled to the second driving IC 22. Specifically, by using the terminal 162c as a dummy terminal, the first driving IC 21 can be checked for output signals and power supply noise via the terminal 161b.

The connecting portion 121 can be used to easily electrically connect the terminal 161b and the terminal 162c. Additionally, the connecting portion 121 is located below the terminal 161b and the uppermost electrode layer forming the terminals, and thus when the first wiring substrate 31 and the second wiring substrate 32 are mounted, contact between the connecting portion 121 and the first wiring substrate 31 or the second wiring substrate 32 is avoided. Specifically, possible short-circuiting can be prevented between the connecting portion 121 and the first wiring substrate 31 or the second wiring substrate 32.

The monitoring pad 322c electrically coupled to the terminal 161b has a reduced wiring length, enabling a reduction in parasitic capacitor. A reduced parasitic capacitor decreases the effect on the driving of the liquid crystal panel 100, reducing occurrence of malfunctioning and the like.

The first wiring substrate 31 and the second wiring substrate 32 have a common configuration, thus facilitating a reduction in the costs of the first wiring substrate 31 and the second wiring substrate 32.

2. Second Embodiment

2.1. Configuration Related to Mounting of Liquid Crystal Apparatus

Figure 11:
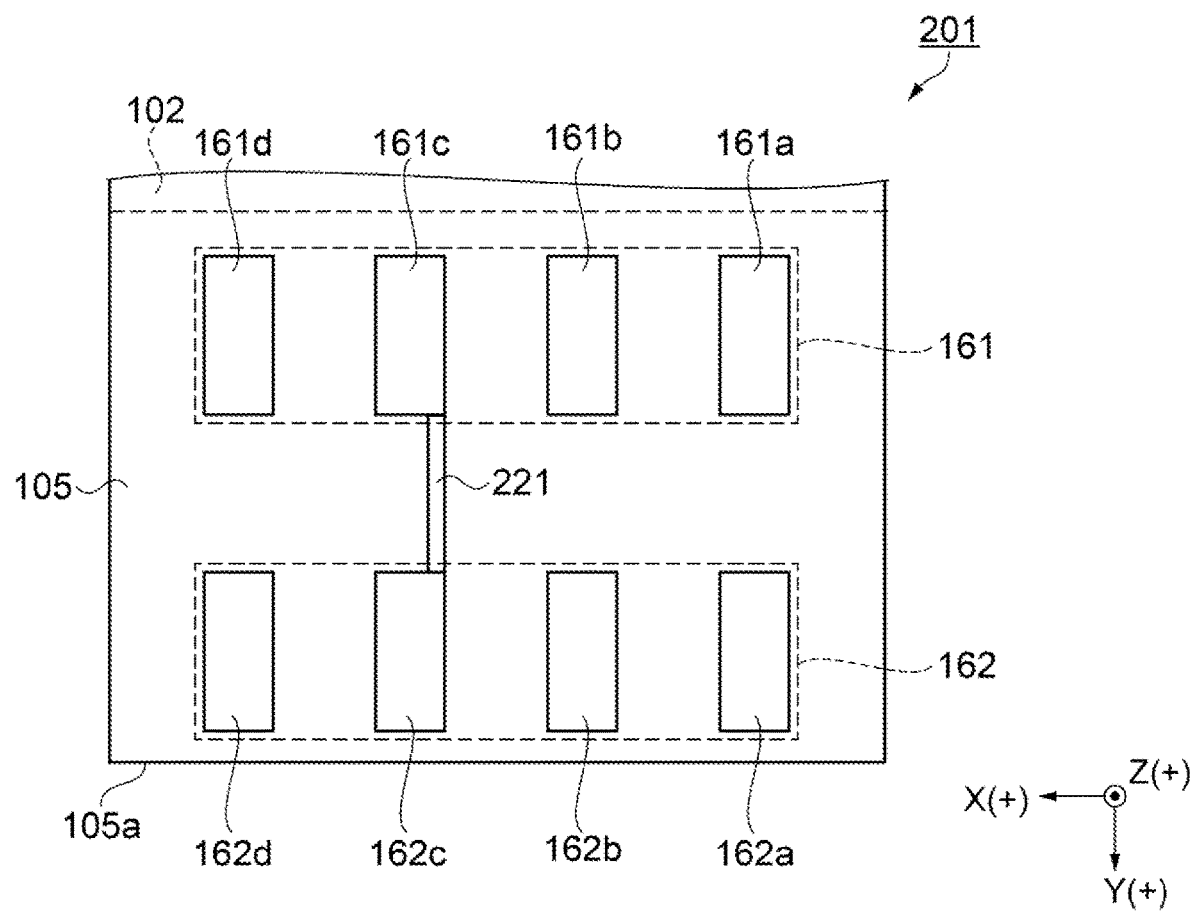
FIG. 11 is a schematic plan diagram illustrating an arrangement of a first terminal, a second terminal, and the like in a liquid crystal panel according to a second embodiment.
Figure 12:
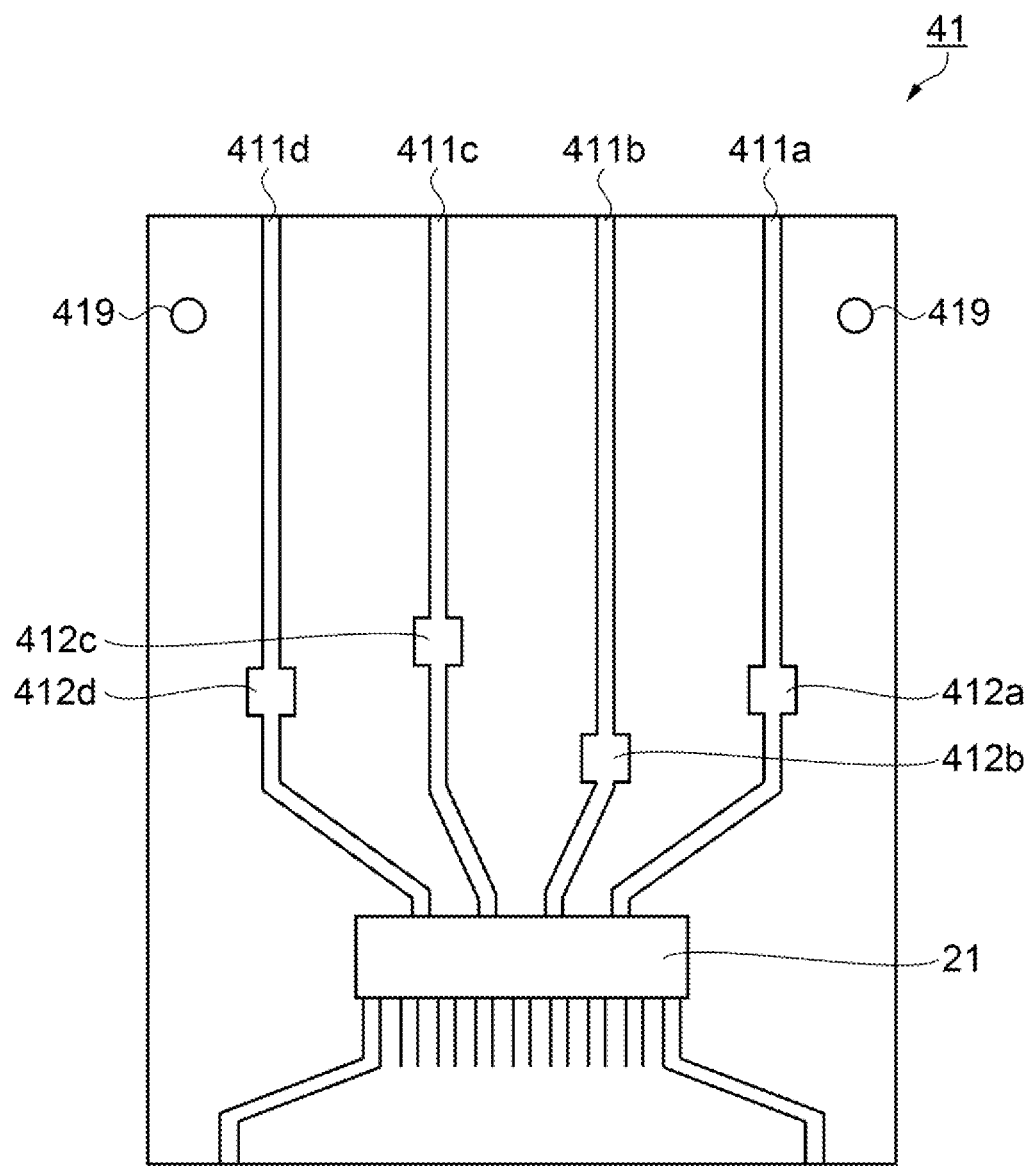
FIG. 12 is a schematic plan diagram illustrating a configuration of a first wiring substrate.
Figure 13:
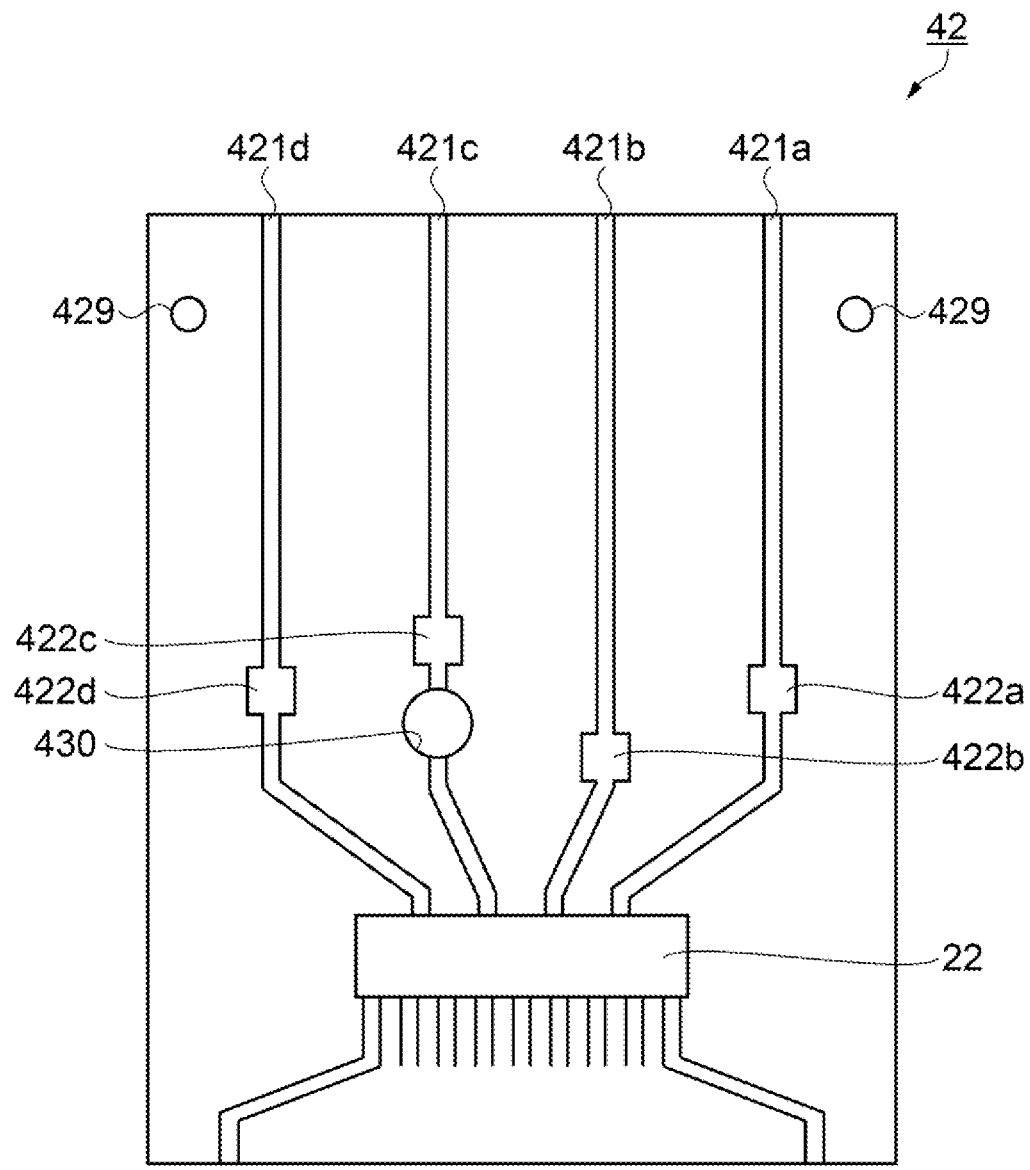
FIG. 13 is a schematic plan diagram illustrating a configuration of a second wiring substrate.
Figure 14:
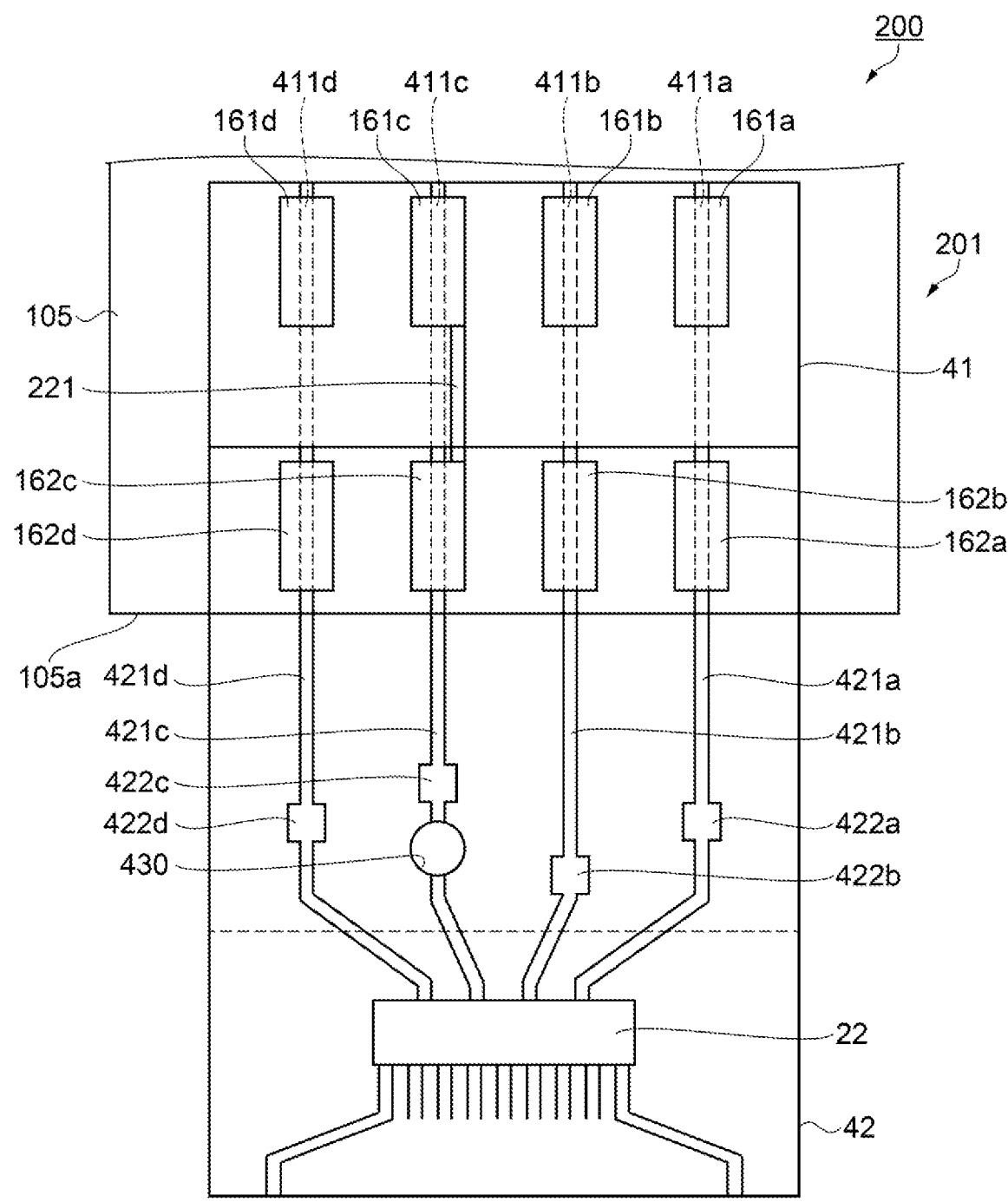
FIG. 14 is a schematic plan diagram illustrating a state in which the first wiring substrate and the second wiring substrate are mounted to a terminal portion.

In the present embodiment, an active drive type liquid crystal apparatus is used as an example of the electro-optical device, and a configuration related to mounting of the liquid crystal apparatus according to the present embodiment will be described with reference to FIGS. 11, 12, 13, and 14. FIG. 11 is a schematic plan diagram illustrating an arrangement of the first terminal, the second terminal, and the like in the liquid crystal panel according to the second embodiment. FIG. 12 is a schematic plan diagram illustrating a configuration of the first wiring substrate. FIG. 13 is a schematic plan diagram illustrating a configuration of the second wiring substrate. FIG. 14 is a schematic plan diagram illustrating a state in which the first wiring substrate and the second wiring substrate are mounted to the terminal portion.

In this case, the liquid crystal apparatus according to the present embodiment differs from the liquid crystal apparatus 1 according to the first embodiment in the arrangement of the connecting portions and the shapes of the first wiring substrate and the second wiring substrate. Thus, the same components as those of the first embodiment are denoted by the same reference signs, and redundant descriptions of these components are omitted.

Note that FIGS. 11 to 14 are schematic diagrams in which the following are omitted: the terminals of the first terminal group 161 and the second terminal group 162, the wiring coupled to the terminals, the wiring coupled to the input terminals of the first driving IC 21 and the second driving IC 22, and the like. Additionally, FIGS. 11 to 14 illustrate a state as viewed from the +Z direction, in other words, illustrate a surface on which various types of wiring are provided. Furthermore, FIG. 11 and FIG. 14 transparently illustrate the first terminal group 161, the second terminal group 162, and the connecting portion.

The liquid crystal apparatus serving as the electro-optical device of the present embodiment includes a liquid crystal panel corresponding to an electro-optical panel, a first wiring substrate, a second wiring substrate, and the like.

As illustrated in FIG. 11, the liquid crystal panel according to the present embodiment includes an element substrate 201 and the counter substrate 102. The terminal portion 105 protruding from the element substrate 201 in the +Y direction is provided with the first terminal group 161 and the second terminal group 162. The first terminal group 161 and the second terminal group 162 are arranged in the same manner as that for the element substrate 101 according to the first embodiment. In this case, the terminal 161c included in the plurality of terminals of the first terminal group 161 is an example of the first terminal according to the present invention. The terminal 162c included in the plurality of terminals of the second terminal group 162 is an example of the second terminal according to the present invention.

The element substrate 201 includes a connecting portion 221. The connecting portion 221 electrically couples the terminal 161c of the first terminal group 161 and the terminal 162c of the second terminal group 162. In plan view from the −Z direction, the connecting portion 221 linearly couples the terminal 161c and the terminal 162c. The connecting portion 221 has a layer arrangement similar to that of the connecting portion 121 according to the first embodiment except for the linear coupling of the terminal 161c and the terminals 162c. The connecting portion 221 need not be linear.

As illustrated in FIG. 12, the first wiring substrate 41 has a rectangular outer shape, and the first driving IC 21 is mounted closer to the lower end of the first wiring substrate 41 with respect to the center in the +Y direction. The first wiring substrate 41 includes coupling wiring 411a, 411b, 411c, and 411d and monitoring pads 412a, 412b, 412c, and 412d serving as a monitor unit. The monitoring pads 412a, 412b, 412c, and 412d are electrically coupled to −Y direction side output terminals of the first driving IC 21; the output terminals are not illustrated. The first wiring substrate 41 is electrically coupled to the first terminal group 161 on the −Y direction side.

In this case, a plurality of pieces of wiring of the first wiring substrate 41 that are not electrically coupled to the first driving IC 21 and that are not illustrated are fed with any of the common voltage LCCOM, the reference voltage VSSY, and the drive voltage VDDY, which are the power supply voltages illustrated in FIG. 5.

When the first wiring substrate 41 is mounted to the terminal portion 105, terminal matching marks 419 on the first wiring substrate 41 may be used for relative alignment in the +X direction and the +Y direction relative to the first terminal group 161 on the terminal portion 105.

The monitoring pad 412c is provided closer to the −Y direction side than the three other monitoring pads 412a, 412b, and 412d. Thus, the coupling wiring 411c for the monitoring pad 412c, extending from the −Y direction end portion of the first wiring substrate 41, is shorter than the coupling wiring for the other monitoring pads. The monitoring pads 412a, 412b, 412c, and 412d have, for example, a size with which the monitoring pads 412a, 412b, 412c, and 412d are visible enough with the help of a loupe or the like in plan view.

As illustrated in FIG. 13, the second wiring substrate 42 has the same design as that of the first wiring substrate 41 in terms of shape and size except that the second wiring substrate 42 is provided with a disconnection portion 430. The second wiring substrate 42 includes coupling wiring, four monitoring pads serving as a monitor unit, and the like, as well as the second driving IC 22 mounted on the second wiring substrate 42.

Specifically, the second wiring substrate 42 has a rectangular outer shape, and the second driving IC 22 is mounted closer to the lower end of the second wiring substrate 42 with respect to the center in the +Y direction. The second wiring substrate 42 includes coupling wiring 421a, 421b, 421c, and 421d and monitoring pads 422a, 422b, 422c, and 422d serving as a monitor unit. Three monitoring pads 422a, 422b, and 422d are electrically coupled to −Y direction side output terminals of the second driving IC 22; the output terminals are not illustrated.

The disconnection portion 430 is provided on wiring electrically coupling the monitoring pad 422c and the output terminal of the second driving IC 22 mounted on the second wiring substrate 42. In other words, at the disconnection portion 430, the wiring coupling the monitoring pad 422c and the output terminal is disconnected. Thus, the monitoring pad 422c is not electrically coupled to the second driving IC 22. Note that the second wiring substrate 42 is electrically coupled to the second terminal group 162 on the −Y direction side. The first driving IC 21 and the second driving IC 22 have the same configuration. For example, a configuration can be employed in which a clock signal provided to the scanning line drive circuit 130 of the liquid crystal panel is delivered from the first driving IC 21. The reason for delivering the clock signal from the first driving IC 21 is that the first terminal group 161 is closer to the scanning line drive circuit 130 than the second terminal group 162 and is thus easy in layout of coupling to the scanning line drive circuit 130 and the like. In this case, the clock signal fed from the second wiring substrate is not required. In such a case, the disconnection portion 430 of the present embodiment can be employed.

The disconnection portion 430 may be provided near the +Y direction side of the monitoring pad 422c. The disconnection portion 430 may be formed by post-machining or the like, with the first wiring substrate 41 and the second wiring substrate 42 having a common configuration. Examples of a method for forming the disconnection portion 430 include punching, laser machining, and the like. Sharing the first wiring substrate 41 and the second wiring substrate 42 facilitates cost reduction.

In this case, a plurality of pieces of wiring of the second wiring substrate 42 that are not electrically coupled to the second driving IC 22 and that are not illustrated are fed with any of the common voltage LCCOM, the reference voltage VSSY, and the drive voltage VDDY, which are the power supply voltages illustrated in FIG. 5.

When the second wiring substrate 42 is mounted to the terminal portion 105, terminal matching marks 429 on the second wiring substrate 42 may be used for relative alignment in the +X direction and the +Y direction relative to the second terminal group 162 on the terminal portion 105.

The monitoring pad 422c is provided closer to the −Y direction side than the three other monitoring pads 422a, 422b, and 422d. Thus, the coupling wiring 421c for the monitoring pad 422c, extending from the −Y direction end portion of the second wiring substrate 42, is shorter than the coupling wiring for the other monitoring pads. The monitoring pads 422a, 422b, 422c, and 422d have, for example, a size with which the monitoring pads 422a, 422b, 422c, and 422d are visible with the help of a loupe or the like in plan view. Note that the second wiring substrate 42 is not limited to the same design as that of the first wiring substrate 41 but may be in a form different from that of the first wiring substrate 41.

As illustrated in FIG. 14, in the liquid crystal panel 200, when the first wiring substrate 41 and the second wiring substrate 42 are mounted to the terminal portion 105 in an overlapping manner, the second wiring substrate 42 is positioned on the +Z direction side of the first wiring substrate 41. Thus, the monitoring pads 422a, 422b, 422c, and 422d of the second wiring substrate 42 are exposed to the +Z direction side, while the monitoring pads 412a, 412b, 412c, and 412d of the first wiring substrate 41 are hidden by the second wiring substrate 42, leading to difficulty in bringing an inspection probe into contact with the monitoring pads 412a, 412b, 412c, and 412d.

Thus, the monitoring pad 422c of the second wiring substrate 42 is used to check the first driving IC 21 for output signals and power supply noise. Specifically, as illustrated in FIG. 12, the coupling wiring 411c of the first wiring substrate 41 is electrically coupled to the output terminal of the first driving IC 21. The coupling wiring 411c is electrically coupled to the terminal 161c corresponding to the first terminal. Specifically, the first driving IC 21 and the terminal 161c are electrically coupled.

The terminal 161c of the first terminal group 161 is electrically coupled to the terminal 162c of the second terminal group 162 via the connecting portion 221. The terminal 162c is electrically coupled to the monitoring pad 422c via the coupling wiring 421c of the second wiring substrate 42. Electrical coupling between the monitoring pad 422c and the second driving IC 22 mounted on the second wiring substrate 42 is eliminated by the disconnection portion 430. According to the configuration described above, the output signal and power supply noise of the first driving IC 21 of the first wiring substrate 41 can be easily confirmed using the monitoring pad 422c of the second wiring substrate 42.

The monitoring pad 422c is disposed closer to the second terminal group 162 than the monitoring pads 422a, 422b, and 422d, which correspond to other monitor unit electrically coupled to the second driving IC 22. Thus, the coupling wiring 421c from the −Y direction end portion of the second wiring substrate 42 is smaller in length than the other coupling wiring.

As described above, the liquid crystal apparatus 1 as the electro-optical device according to the present embodiment can provide the following advantages.

The disconnection portion 430 allows easily provision of the monitoring pad 422c not electrically coupled to the second driving IC 22. Additionally, by providing the disconnection portion 430 on the second wiring substrate 42 in post-machining, the first wiring substrate 41 and the second wiring substrate 42 can have a common configuration and be used differently. Thus, compared to a case where the first wiring substrate 41 and the second wiring substrate 42 have individual specifications, the present configuration can reduce the costs.

Additionally, the disconnection portion 430 can avoid overlapping of the outputs of the first driving IC 21 and the second driving IC 22.

Input terminals other than image signal-based terminals are applicable to the terminals 161c and 162c, and thus dummy terminals need not be provided as in the first embodiment. Thus, an increase in the number of terminals in the terminal portion 105 can be suppressed.

Figure 15:
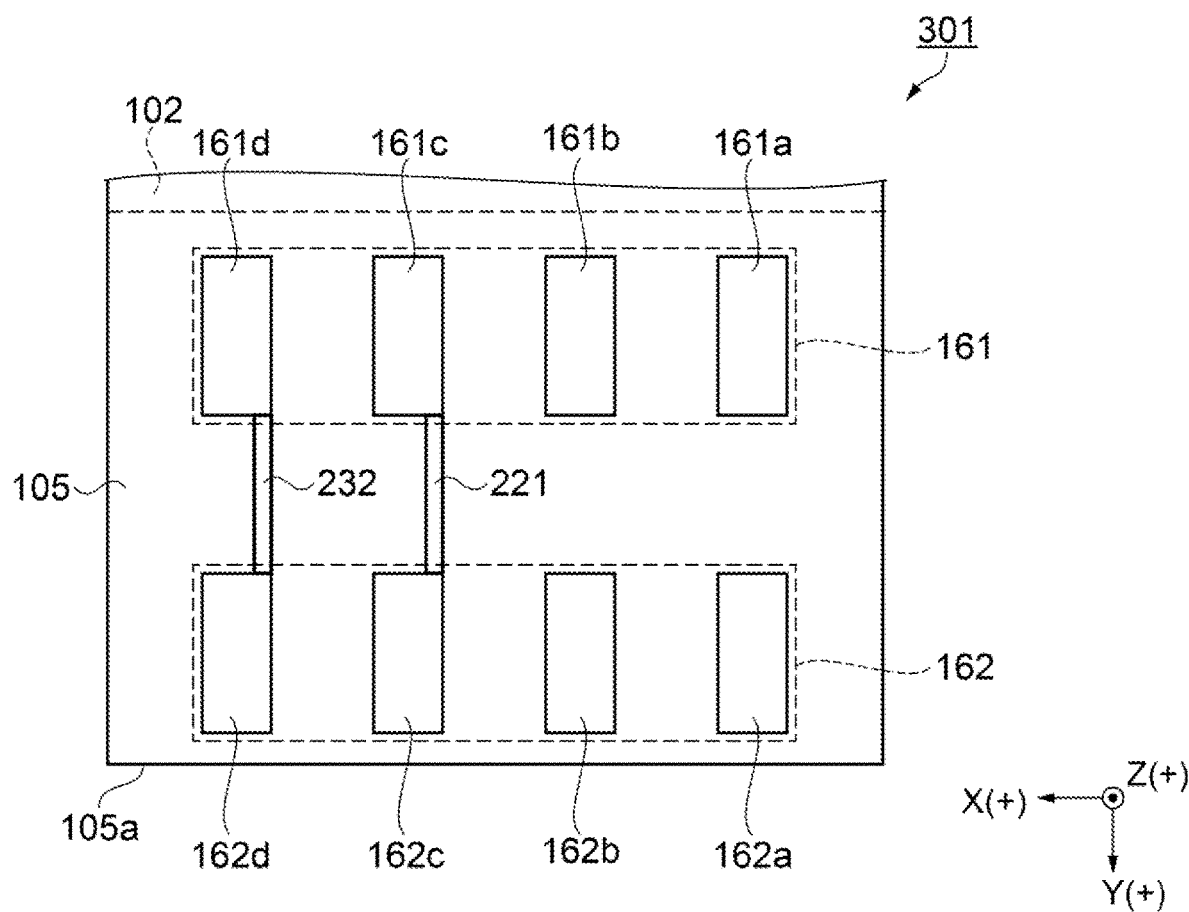
FIG. 15 is a schematic plan diagram illustrating an arrangement of a first terminal, a second terminal, and the like in a liquid crystal panel according to a third embodiment.
Figure 16:
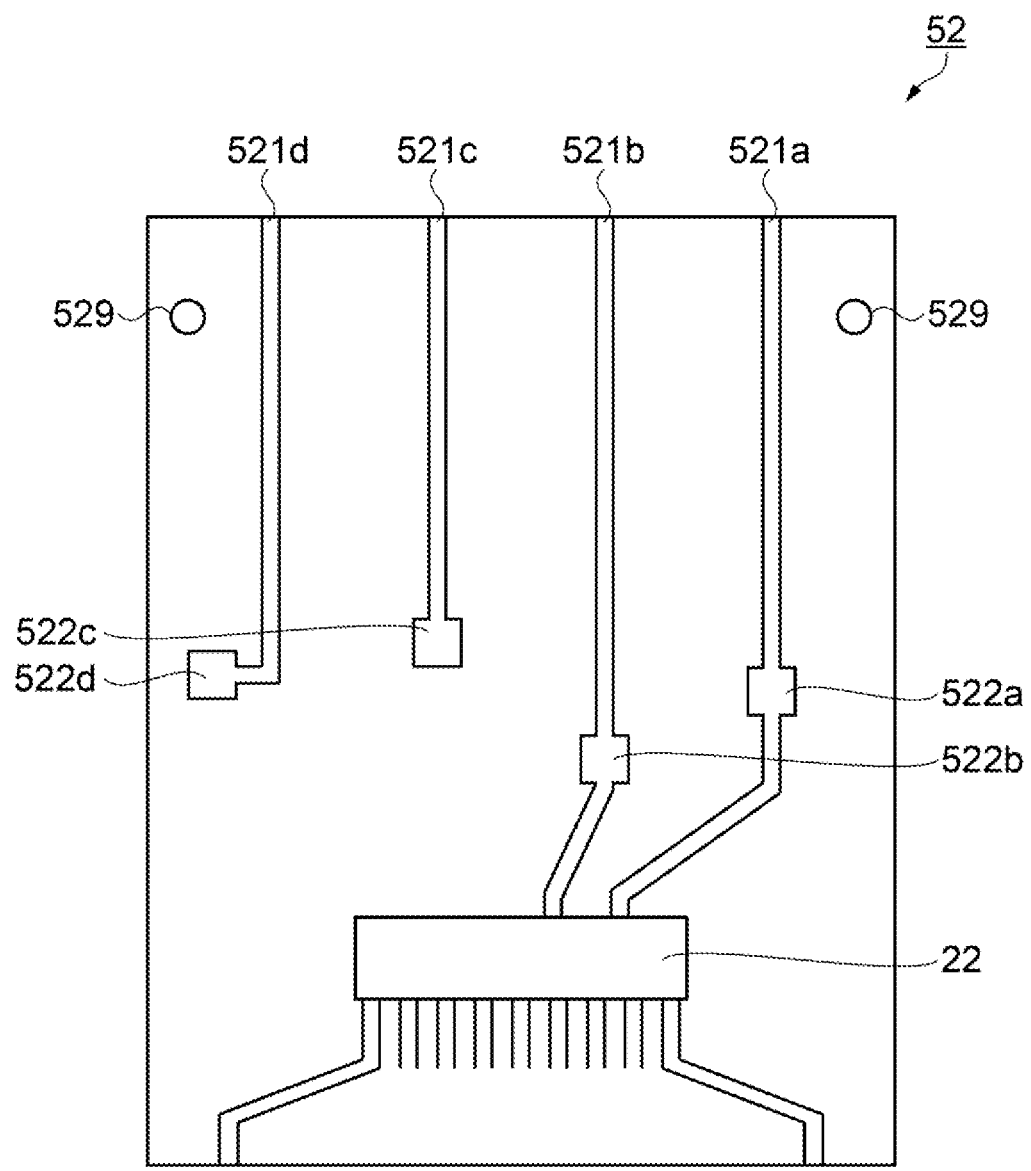
FIG. 16 is a schematic plan diagram illustrating a configuration of a second wiring substrate.
Figure 17:
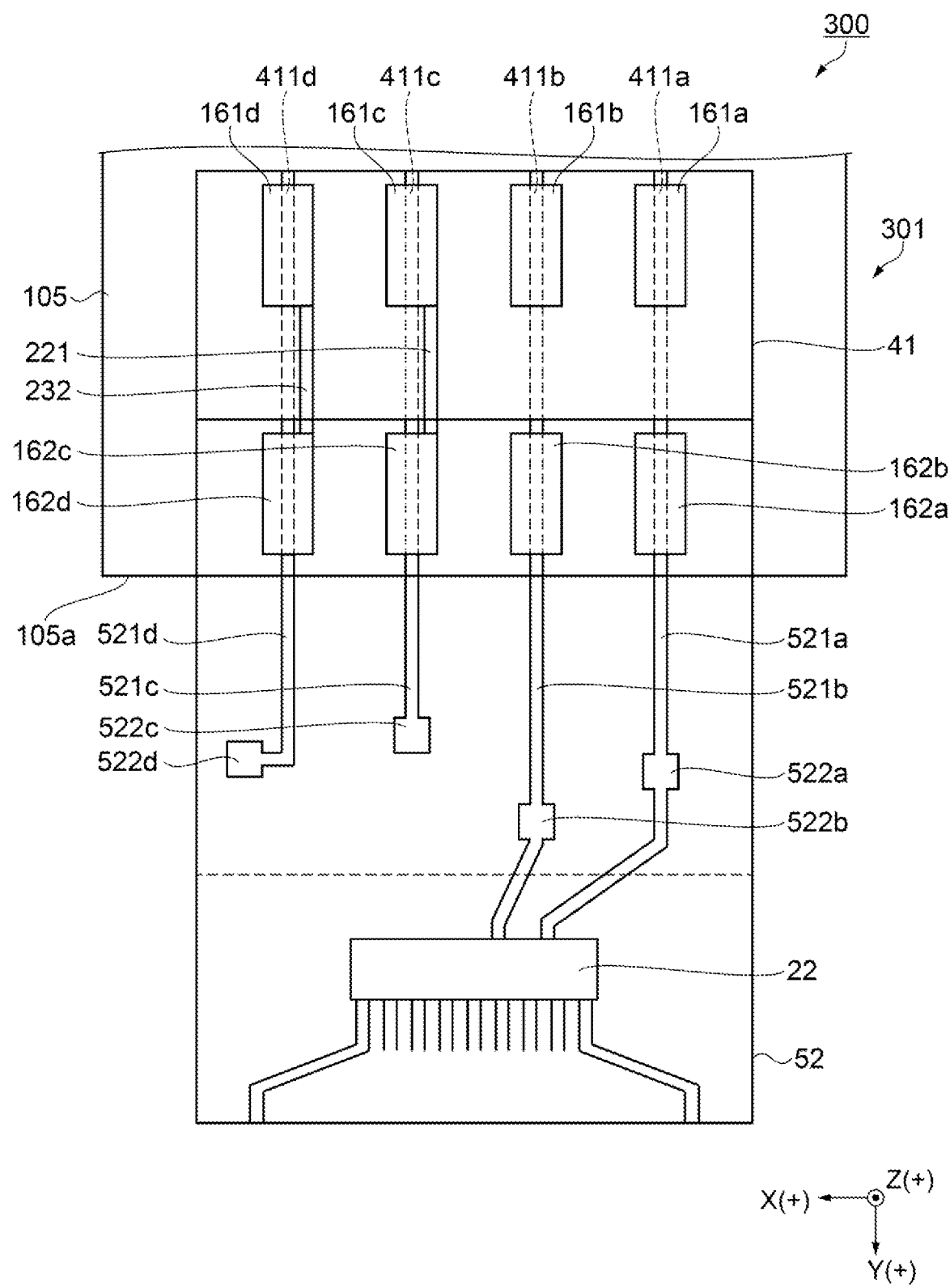
FIG. 17 is a schematic plan diagram illustrating a state in which the first wiring substrate and the second wiring substrate are mounted to a terminal portion.

3. Third Embodiment 3.1. Configuration Related to Mounting of Liquid Crystal Apparatus In the present embodiment, an active drive type liquid crystal apparatus is used as an example of the electro-optical device, and a configuration related to mounting of the liquid crystal apparatus according to the present embodiment will be described with reference to FIGS. 15, 16, and 17. FIG. 15 is a schematic plan diagram illustrating an arrangement of the first terminal, the second terminal, and the like in the liquid crystal panel according to the third embodiment. FIG. 16 is a schematic plan diagram illustrating a configuration of the second wiring substrate. FIG. 17 is a schematic plan diagram illustrating a state in which the first wiring substrate and the second wiring substrate are mounted to the terminal portion.

In this case, the liquid crystal apparatus according to the present embodiment differs from the liquid crystal apparatus according to the second embodiment in the arrangement of the connecting portion and the shape of the second wiring substrate. The first wiring substrate in the present embodiment uses the first wiring substrate 41 according to the second embodiment. Accordingly, the same components as those of the second embodiment are denoted by the same reference signs, and redundant descriptions of these components are omitted.

Note that FIGS. 15 to 17 are schematic diagrams in which the following are omitted: the terminals of the first terminal group 161 and the second terminal group 162, the wiring coupled to the terminals, the wiring coupled to the input terminals of the first driving IC 21 and the second driving IC 22, and the like. Additionally, FIGS. 15 to 17 illustrate a state as viewed from the +Z direction, in other words, illustrate a surface on which various types of wiring and the like are provided. Furthermore, FIG. 15 and FIG. 17 transparently illustrate the first terminal group 161, the second terminal group 162, and the connecting portion.

The liquid crystal apparatus serving as the electro-optical device of the present embodiment includes a liquid crystal panel corresponding to an electro-optical panel, a first wiring substrate, a second wiring substrate, and the like.

As illustrated in FIG. 15, a liquid crystal panel according to the present embodiment includes an element substrate 301 and the counter substrate 102. The terminal portion 105 protruding from the element substrate 301 in the +Y direction is provided with the first terminal group 161 and the second terminal group 162. The first terminal group 161 and the second terminal group 162 are arranged in the same manner as that for the element substrate 101 according to the first embodiment. In this case, the terminal 161c included in the plurality of terminals of the first terminal group 161 is an example of the first terminal according to the present invention, and the terminal 161d also included in the plurality of terminals of the first terminal group 161 is an example of a third terminal according to the present invention. The terminal 162c included in the plurality of terminals of the second terminal group 162 is an example of the second terminal according to the present invention, and the terminal 162d also included in the plurality of terminals of the second terminal group 162 is an example of a fourth terminal according to the present invention.

The element substrate 301 includes the terminal 161c as the first terminal, the terminal 162c as the second terminal, the terminal 161d as the third terminal, and the terminal 162d as the fourth terminal, and connecting portions 221 and 232. The connecting portion 221 electrically couples the terminal 161c of the first terminal group 161 and the terminal 162c of the second terminal group 162. The connecting portion 232 electrically couples the terminal 161d of the first terminal group 161 and the terminal 162d of the second terminal group 162.

In plan view from the −Z direction, the connecting portion 221 linearly couples the terminal 161c and the terminal 162c. In a plan view from the −Z direction, the connecting portion 232 linearly couples the terminal 161d and the terminal 162d. In the above plan view, the connecting portions 221 and 232 have a layer arrangement similar to that of the connecting portion 121 according to the first embodiment except for the linear arrangement of the connecting portions 221 and 232. The connecting portions 221 and 232 need not be linear.

As illustrated in FIG. 16, the second wiring substrate 52 differs from the first wiring substrate 41 in the arrangement of the wiring. Specifically, the second wiring substrate 52 according to the present embodiment has a design different from the first wiring substrate 41.

Specifically, the second wiring substrate 52 has a rectangular outer shape, and the second driving IC 22 is mounted closer to the lower end of the second wiring substrate 52 with respect to the center in the +Y direction. The second wiring substrate 52 includes coupling wiring 521a, 521b, 521c, and 521d and monitoring pads 522a, 522b, 522c, and 522d serving as a monitor unit. The monitoring pads 522a and 522b are electrically coupled to −Y direction side output terminals of the second driving IC 22; the output terminals are not illustrated.

No wiring is provided between the second driving IC 22 and the monitoring pads 522c and 522d. The coupling wiring 521d is bent in the +X direction near the monitoring pad 522d, and is coupled to the monitoring pad 522d. Thus, the monitoring pad 522d is displaced in the +X direction relative to the monitoring pad 422d of the second wiring substrate 42 according to the second embodiment.

In this case, a plurality of pieces of wiring of the second wiring substrate 52 that are not electrically coupled to the second driving IC 22 and that are not illustrated are fed with any of the common voltage LCCOM, the reference voltage VSSY, and the drive voltage VDDY, which are the power supply voltages illustrated in FIG. 5.

When the second wiring substrate 52 is mounted to the terminal portion 105, terminal matching marks 529 on the second wiring substrate 52 may be used for relative alignment in the +X direction and the +Y direction relative to the second terminal group 162 on the terminal portion 105.

The monitoring pads 522c and 522d are provided closer to the −Y direction side than the two other monitoring pads 522a and 522b. Thus, the coupling wiring 521c and 521d for the monitoring pads 522c and 522d, extending from the −Y direction end portion of the second wiring substrate 52, is shorter than the coupling wiring for the other monitoring pads. The monitoring pads 522a, 522b, 522c, and 522d have, for example, a size with which the monitoring pads 522a, 522b, 522c, and 522d are visible with the help of a loupe or the like in plan view.

As illustrated in FIG. 17, in the liquid crystal panel 300, when the first wiring substrate 41 and the second wiring substrate 52 are mounted to the terminal portion 105 in an overlapping manner, the second wiring substrate 52 is positioned on the +Z direction side of the first wiring substrate 41. Thus, the monitoring pads 522a, 522b, 522c, and 522d of the second wiring substrate 52 are exposed to the +Z direction side, while the monitoring pads 412a, 412b, 412c, and 412d of the first wiring substrate 41 are hidden by the second wiring substrate 52, leading to difficulty in bringing an inspection probe into contact with the monitoring pads 412a, 412b, 412c, and 412d.

Thus, the monitoring pads 522c and 522d of the second wiring substrate 52 are used to check the first driving IC 21 for output signals and power supply noise. Specifically, as illustrated in FIG. 12, the coupling wiring 411c and 411d of the first wiring substrate 41 are electrically coupled to the output terminal of the first driving IC 21. The coupling wiring 411c is electrically coupled to the terminal 161c corresponding to the first terminal. The coupling wiring 411d is electrically coupled to the terminal 161d corresponding to the third terminal. In other words, the first driving IC 21 and the terminals 161c and 161d are electrically coupled.

The terminal 161c of the first terminal group 161 is electrically coupled to the terminal 162c of the second terminal group 162 via the connecting portion 221. The terminal 162c is electrically coupled to the monitoring pad 522c via the coupling wiring 521c of the second wiring substrate 52. The monitoring pad 522c is not electrically coupled to the second driving IC 22 mounted on the second wiring substrate 52.

The terminal 161d of the first terminal group 161 is electrically coupled via the connecting portion 232 to the terminal 162d corresponding to the fourth terminal of the second terminal group 162. The terminal 162d is electrically coupled to the monitoring pad 522d via the coupling wiring 521d of the second wiring substrate 52. The monitoring pad 522d is not electrically coupled to the second driving IC 22 mounted on the second wiring substrate 52. Specifically, the second wiring substrate 52 includes the monitoring pad 522d serving as other monitor unit and electrically coupled to the terminal 161d of the first wiring substrate 41 via the terminal 162d.

According to the configuration described above, the first driving IC 21 on the first wiring substrate 41 can be easily checked for output signals and power supply noise using the monitoring pads 522c and 522d of the second wiring substrate 52.

As described above, the liquid crystal apparatus serving as the electro-optical device according to the present embodiment can provide the following advantages.

Output signals and power supply noise from the first driving IC 21 on the first wiring substrate 41 can be checked using the plurality of monitoring pads 522c and 522d. Specifically, a plurality of types of output signals and power supply noise can be checked.

4. Fourth Embodiment

4.1. Electronic Apparatus

Figure 18:
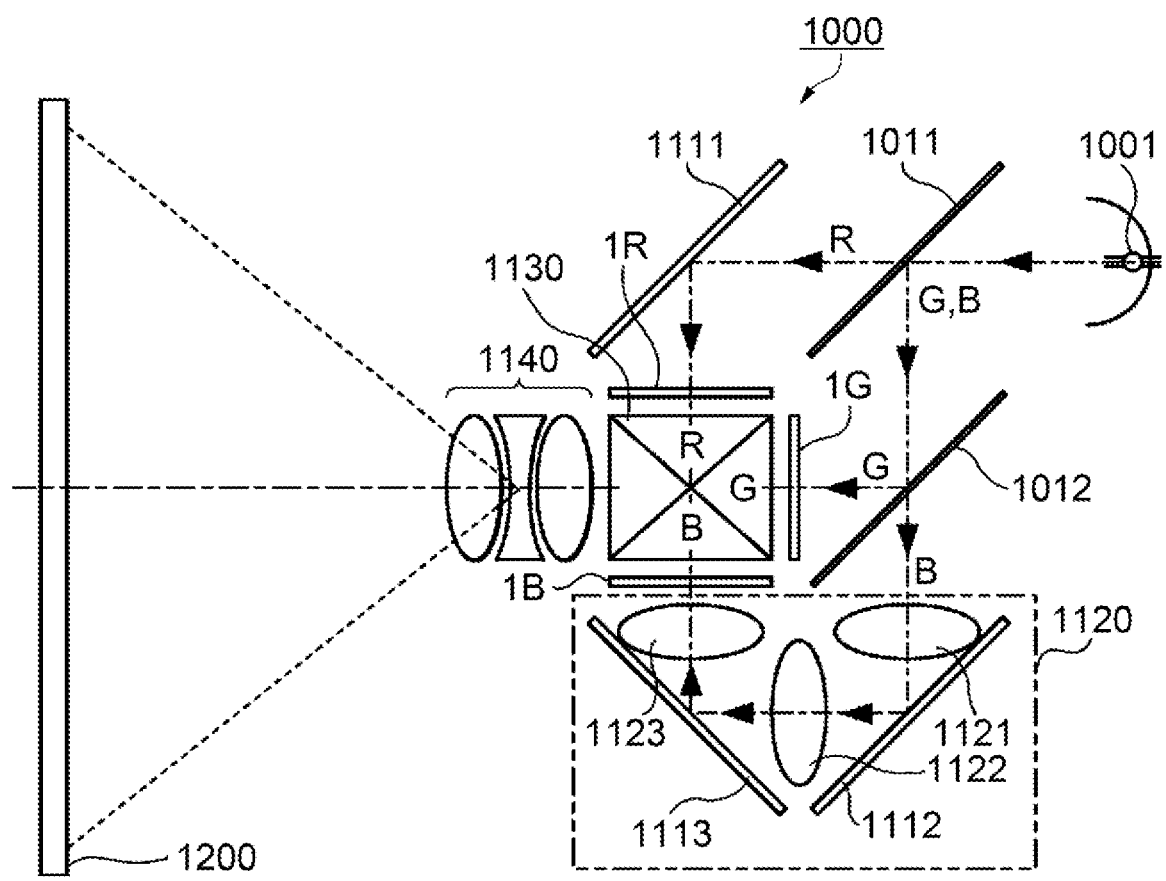
FIG. 18 is a view schematically illustrating a configuration of a projection-type display apparatus as an electronic apparatus according to a fourth embodiment.

Now, with reference to FIG. 18, an electronic apparatus according to the present embodiment will be described by using a projection-type display apparatus as an example. FIG. 18 is a schematic diagram illustrating a configuration of the projection-type display apparatus serving as the electronic apparatus according to the fourth embodiment.

As illustrated in FIG. 18, a projection-type display apparatus 1000 as an electronic apparatus according to the present embodiment includes a lamp unit 1001 as a light source, dichroic mirrors 1011 and 1012 as a color separation optical system, three liquid crystal apparatuses 1B, 1G, and 1R corresponding to an electro-optical panel, three reflective mirrors 1111, 1112, and 1113, three relay lenses 1121, 1122, and 1123, a dichroic prism 1130 as a color synthesis optical system, and a projection lens 1140 as a projection optical system.

As the lamp unit 1001, for example, a discharge type light source is employed. The method for the light source is not limited to the discharge type, and a solid-state light source such as a light emitting diode or a laser may be employed.

Light emitted from the lamp unit 1001 is separated by two dichroic mirrors 1011 and 1012 into colored light in three colors in different wavelength regions. The colored light in three colors includes substantially red light, substantially green light, and substantially blue light. In the following description, the substantially red light is also referred to as the red light R, the substantially green light is also referred to as green light G, and the substantially blue light is also referred to as blue light B.

The dichroic mirror 1011 transmits the red light R and reflects the green light G and blue light B, having a shorter wavelength than the red light R. The red light R transmitted through the dichroic mirror 1011 is reflected by the reflection mirror 1111 and enters the liquid crystal apparatus 1R. The green light G reflected by the dichroic mirror 1011 is reflected by the dichroic mirror 1012 and then enters the liquid crystal apparatus 1G. The blue light B reflected by the dichroic mirror 1011 is transmitted through the dichroic mirror 1012 and emitted into the relay lens system 1120.

The relay lens system 1120 includes a relay lens 1121, 1122, and 1123 and reflection mirrors 1112 and 1113. The blue light B travels through a longer light path than the green light G and the red light R, and thus tends to have a large light flux. Thus, the relay lens 1122 is used to suppress enlargement of the light flux. The blue light B incident on the relay lens system 1120 is reflected by the reflection mirror 1112 and converged near the relay lens 1122 by the relay lens 1121. The blue light B passes through the reflective mirror 1113 and the relay lens 1123 and then enters the liquid crystal apparatus 1B.

The liquid crystal apparatus 1 as the electro-optical device according to the first embodiment is applied to the liquid crystal apparatuses 1R, 1G, and 1B, which are optical modulating apparatuses, in the projection-type display apparatus 1000. Additionally, a liquid crystal apparatus other than the liquid crystal apparatus according to the first embodiment may be applied as the liquid crystal apparatuses 1R, 1G, and 1B.

Each of the liquid crystal apparatuses 1R, 1G, and 1B is electrically coupled to an upper circuit of the projection-type display apparatus 1000 via the first extension substrate 341 and the second extension substrate 342 described above. Thus, image signals specifying gray scale levels of the red light R, the green light G, and the blue light B are fed from the external circuit and processed by the upper circuit. Thus, the liquid crystal apparatuses 1R, 1G, and 1B are driven to modulate the colored light in the respective colors.

The red light R, green light G, and blue light B modulated by the liquid crystal apparatuses 1R, 1G, and 1B are incident on the dichroic prism 1130 from three directions. The dichroic prism 1130 synthesizes incident red light R, green light G, and blue light B. In the dichroic prism 1130, the red light R and the blue light B are reflected at 90 degrees, and the green light G is transmitted. Thus, the red light R, the green light G, and the blue light B are synthesized into display light displaying a color image, and the display light is emitted toward the projection lens 1140.

The projection lens 1140 is disposed facing the outside of the projection-type display apparatus 1000. The display light is enlarged and emitted via the projection lens 1140 and projected onto the screen 1200 used as a projection target.

In the present embodiment, a projection-type display apparatus 1000 is illustrated as an electronic apparatus, but the electronic apparatus to which the electro-optical apparatus according to an embodiment of the present invention is applied is not limited to the projection-type display apparatus 1000. For example, the electro-optical apparatus according to an embodiment of the present invention may be applied to electronic apparatuses such as a projection-type head-up display (HUD), a direct view head mounted display (HMD), and a display apparatus, a personal computer, a digital camera, and a liquid crystal television using an organic light emitting diode (OLED).

5. First Modified Example

Figure 19:
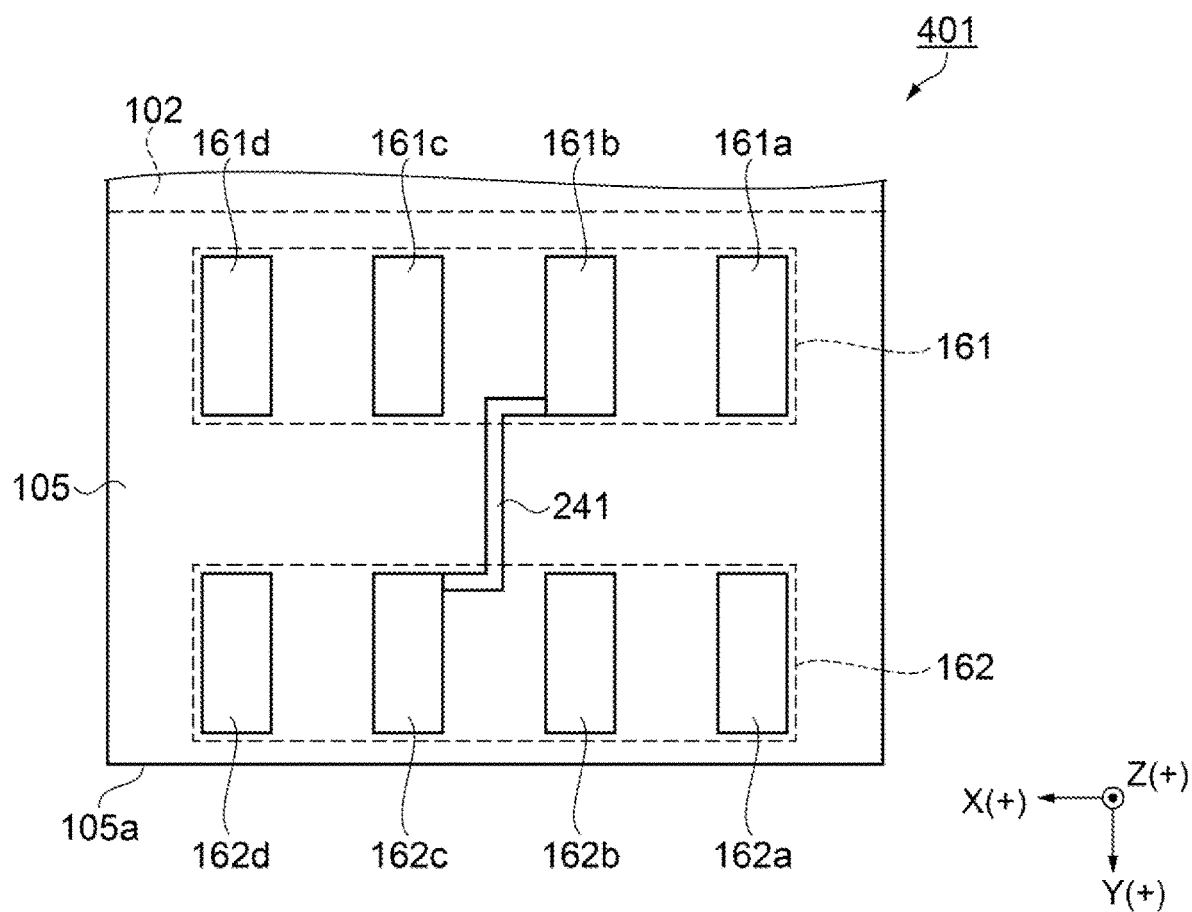
FIG. 19 is a schematic plan diagram illustrating an arrangement of a first terminal, a second terminal, and the like in a liquid crystal panel according to a first modified example.

Now, a first modified example will be described with reference to FIG. 19. FIG. 19 is a schematic plan diagram illustrating an arrangement of the first terminal, the second terminal, and the like in the liquid crystal panel according to the first modified example. In this case, the liquid crystal apparatus serving as the electro-optical device according to the present modified example corresponds to the liquid crystal apparatus 1 according to the first embodiment including a different arrangement of the connecting portion. Thus, the same components as those of the first embodiment are denoted by the same reference signs, and redundant descriptions of these components are omitted. Note that FIG. 19 is a schematic diagram in which the terminals of the first terminal group 161 and the second terminal group 162, the wiring coupled to the terminals, and the like are omitted. Additionally, FIG. 19 illustrates a state as viewed from the opposite, +Z direction, in other words, illustrates a surface on which various types of wiring and the like are provided. Furthermore, FIG. 19 transparently illustrates the first terminal group 161, the second terminal group 162, and the connecting portion.

As illustrated in FIG. 19, the liquid crystal panel provided in the liquid crystal apparatus of the present embodiment includes an element substrate 401 and the counter substrate 102. The terminal portion 105 protruding from the element substrate 401 in the +Y direction is provided with the first terminal group 161 and the second terminal group 162. The first terminal group 161 and the second terminal group 162 are arranged in the same manner as that for the element substrate 101 according to the first embodiment.

The terminal 161b corresponding to the first terminal of the first terminal group 161 and the terminal 162c corresponding to the second terminal of the second terminal group 162 are electrically coupled by the connecting portion 241. The connecting portion 241 is drawn from the +Y direction end portion of the terminal 161b, and bent approximately through a right angle at a position midway between the terminal 161b and the terminal 161c in the X direction, and extends in the +Y direction. The connecting portion 241 is then bent approximately through a right angle in the +X direction near the −Y direction end portion of the terminal 162c, and is coupled to the terminal 162c.

Thus, compared to the connecting portion 121 according to the first embodiment, the connecting portion 241 is prevented, when being disposed parallel to the coupling wiring 311b corresponding to the terminal 162b and not illustrated, from lying in proximity to the coupling wiring 311b. Thus, conduction between the connecting portion 241 and the coupling wiring 311b can be suppressed in a pressure attaching step for mounting.

6. Second Modified Example

Figure 20:
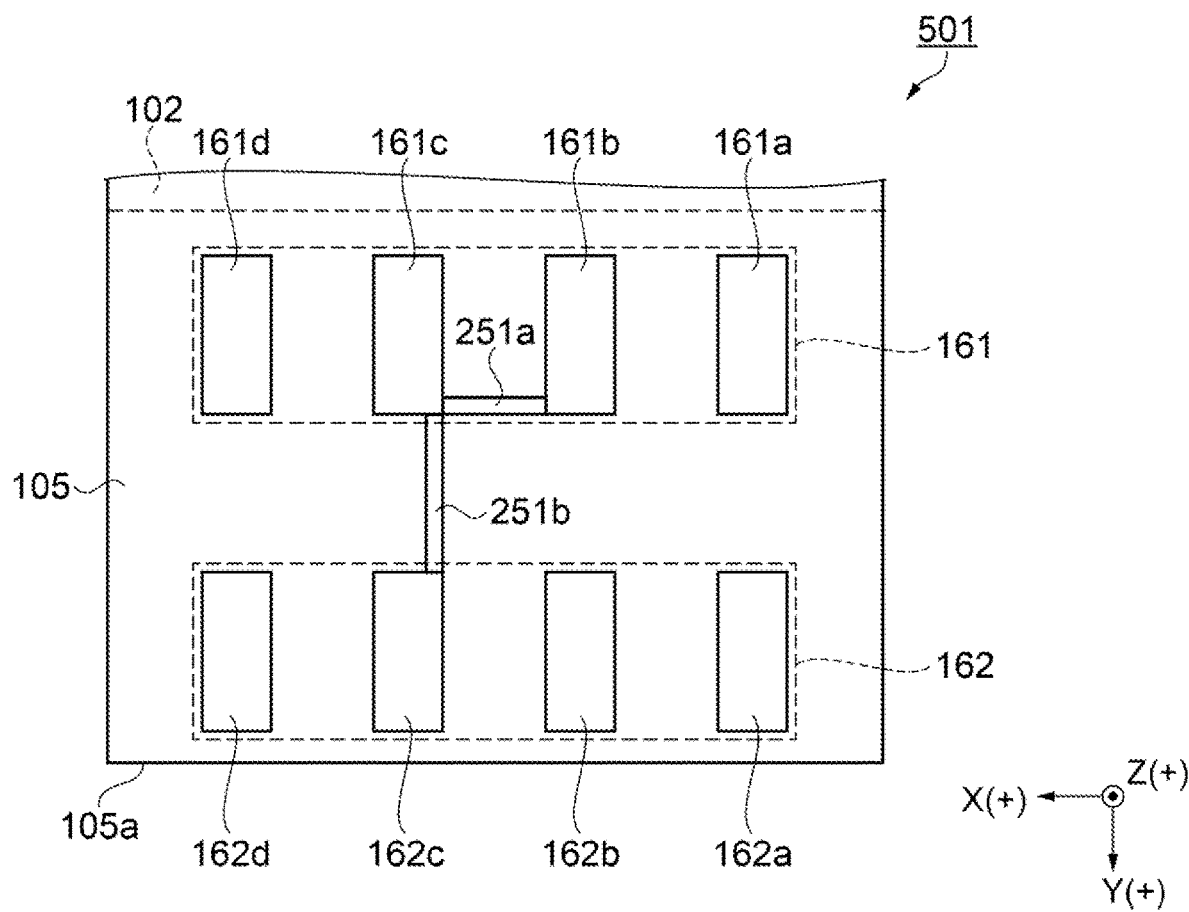
FIG. 20 is a schematic plan diagram illustrating an arrangement of a first terminal, a second terminal, and the like in a liquid crystal panel according to a second modified example.

A second modified example will be described below with reference to FIG. 20. FIG. 20 is a schematic plan diagram illustrating an arrangement of the first terminal, the second terminal, and the like in the liquid crystal panel according to the second modified example. In this case, the liquid crystal apparatus serving as the electro-optical device according to the present modified example corresponds to the liquid crystal apparatus 1 according to the first embodiment including a different arrangement of the connecting portion. Thus, the same components as those of the first embodiment are denoted by the same reference signs, and redundant descriptions of these components are omitted. Note that FIG. 20 is a schematic diagram in which the terminals of the first terminal group 161 and the second terminal group 162, the wiring coupled to the terminals, and the like are omitted. Additionally, FIG. 20 illustrates a state as viewed from the opposite, +Z direction, in other words, illustrates a surface on which various types of wiring and the like are provided. Furthermore, FIG. 20 transparently illustrates the first terminal group 161, the second terminal group 162, and the connecting portion.

As illustrated in FIG. 20, the liquid crystal panel provided in the liquid crystal apparatus according to the present embodiment includes an element substrate 501 and the counter substrate 102. The terminal portion 105 protruding from the element substrate 501 in the +Y direction is provided with the first terminal group 161 and the second terminal group 162. The first terminal group 161 and the second terminal group 162 are arranged in the same manner as that for the element substrate 101 according to the first embodiment.

The terminal 161b of the first terminal group 161 and the terminal 162c of the second terminal group 162 are electrically coupled by the connecting portion 251a and 251b via the terminal 161c of the first terminal group 161, corresponding to a dummy terminal. The connecting portion 251a is drawn from a +Y direction end portion of the terminal 161b in the +X direction, and is coupled to a +Y direction end portion of the terminal 161c. The connecting portion 251b is drawn from a +Y direction and −X direction end portion of the terminal 161c in the +Y direction, extends in the +Y direction, is coupled to a −Y direction end portion of the terminal 162c.

Thus, compared to the connecting portion 121 according to the first embodiment, the connecting portions 251a and 251b are prevented, when being disposed parallel to the coupling wiring 311b corresponding to the terminal 162b and not illustrated, from lying in proximity to the coupling wiring 311b. Thus, conduction between the coupling wiring 311b and the connecting portions 251a and 251b can be suppressed in a pressure attaching step for mounting.

As described above, the projection-type display apparatus 1000 according to the present embodiment can provide the following advantages.

A projection-type display apparatus 1000 can be provided that facilitates checking of driving elements such as the first driving IC 21 for output signals and power supply noise, allows easy display tests on the liquid crystal apparatus 1, and has improved quality such as improved display characteristics.

Contents derived from the embodiments will be described below.

The electro-optical device includes a first wiring substrate on which a first driving element is mounted, a second wiring substrate disposed to overlap the first wiring substrate, a first terminal group electrically coupled to the first wiring substrate and including a first terminal electrically coupled to the first driving element, a second terminal group electrically coupled to the second wiring substrate and including a second terminal electrically coupled to the first terminal, and a monitor unit provided on the second wiring substrate and electrically coupled to the second terminal.

According to this configuration, the first driving element on the first wiring substrate can be checked for output signals and power supply noise more easily than in the related art. Specifically, the electro-optical apparatus includes the first terminal group and the second terminal group in order to support an increased resolution of pixels. The first wiring substrate and the second wiring substrate are respectively electrically coupled to the first terminal group and the second terminal group, and the second wiring substrate is disposed to overlap the first wiring substrate. The first terminal of the first terminal group is electrically coupled to the monitor unit of the second wiring substrate via the second terminal of the second terminal group. Thus, even when the wiring of the first wiring substrate is present on the inner side of the first wiring substrate and the second wiring substrate, disposed in an overlapping manner, the monitor unit can be used to check the first driving IC for output signals and power supply noise. Accordingly, an electro-optical device facilitating checking of the wiring substrates for output signals and power supply noise can be provided.

The electro-optical device described above may be configured such that the monitor unit is not electrically coupled to the second driving element mounted on the second wiring substrate.

According to this configuration, the second terminal electrically coupled to the monitor unit is also not electrically coupled to the second driving element. In other words, by using the second terminal as the dummy terminal, output signals and the power supply noise from the first driving element can be checked via the first terminal.

In the electro-optical device described above, the second wiring substrate may be provided with a disconnection portion in which wiring electrically coupling the second driving element mounted on the second wiring substrate and the monitor unit is disconnected.

According to this configuration, the disconnection portion allows easy provision of the second terminal not electrically coupled to the second driving element. Additionally, by providing the disconnection portion on the second wiring substrate in post-machining, the first wiring substrate and the second wiring substrate can have a common configuration and be used differently. Thus, compared to a case where the first wiring substrate and the second wiring substrate have individual specifications, the present configuration can reduce the costs.

The electro-optical device may include a coupling unit configured to electrically couple the first terminal and the second terminal, and the coupling unit may be provided in a layer below a layer in which the first terminal and the second terminal are provided.

According to this configuration, the first terminal and the second terminal can be easily electrically coupled by the connecting portion. Additionally, since the connecting portion is located in the layer below the first terminal and the second terminal, contact between the connecting portion and the first wiring substrate or the second wiring substrate is avoided when the first wiring substrate and the second wiring substrate are mounted. Specifically, short circuiting can be prevented between the connecting portion and the first wiring substrate or the second wiring substrate.

In the electro-optical device described above, the monitor unit may be disposed closer to the second terminal group than other monitor unit electrically coupled to the second driving element.

According to this configuration, the monitor unit electrically coupled to the first terminal has a reduced wiring length, enabling a reduction in parasitic capacitor. A reduced parasitic capacitor decreases the effect on the driving of the electro-optical panel, reducing occurrence of malfunctioning and the like.

In the electro-optical device described above, the first terminal group may include a third terminal electrically coupled to the first driving element, the second terminal group may include a fourth terminal electrically coupled to the third terminal, and the second wiring circuit may include other monitor unit electrically coupled to the fourth terminal.

According to this configuration, the first driving element on the first wiring substrate can be checked for output signals and power supply noise using other monitor unit in addition to the above-described monitor unit. Specifically, a plurality of types of output signals and power supply noise can be checked.

An electronic apparatus according to an aspect of the disclosure includes the above-described electro-optical device.

According to this configuration, an electronic apparatus can be provided that facilitates checking of the first driving elements for output signals and power supply noise, allows easy display tests on the electro-optical panel, and has improved quality such as improved display characteristics.

What is claimed is:

1. An electro-optical device comprising:
   a first wiring substrate on which a first driving element is mounted;
   a second wiring substrate disposed to overlap the first wiring substrate;
   a first terminal group electrically connected to the first wiring substrate and including a first terminal electrically connected to the first driving element;
   a second terminal group electrically connected to the second wiring substrate and including a second terminal electrically connected to the first terminal; and
   a monitor unit provided on the second wiring substrate, connected to the second terminal and electrically connected to the first driving element via the second terminal and the first terminal.

2. The electro-optical device according to claim 1, further comprising:
   a second driving element mounted on the second wiring substrate, wherein
   the monitor unit is not electrically connected to the second driving element mounted on the second wiring substrate.

3. The electro-optical device according to claim 2, wherein
   the second wiring substrate is provided with a disconnection portion at which electrical connection between the second driving element mounted on the second wiring substrate and the monitor unit is disconnected.

4. The electro-optical device according to claim 1, comprising:
   a connecting portion configured to electrically connect the first terminal and the second terminal, wherein
   the connecting portion is provided in a layer below a layer in which the first terminal and the second terminal are provided.

5. The electro-optical device according to claim 1, wherein
   the monitor unit is disposed closer to the second terminal group than other monitor units electrically connected to the second driving element.

6. The electro-optical device according to claim 1, wherein
   the first terminal group comprises a third terminal electrically connected to the first driving element,
   the second terminal group includes a fourth terminal electrically connected to the third terminal, and
   the second wiring substrate includes another monitor unit electrically connected to the fourth terminal.

7. An electronic apparatus comprising the electro-optical device according to claim 1.

8. An electro-optical device comprising:
- a first wiring substrate on which a first driving element is mounted;
- a second wiring substrate disposed to overlap the first wiring substrate;
- a first terminal group electrically connected to the first wiring substrate and including a first terminal electrically connected to the first driving element;
- a second terminal group electrically connected to the second wiring substrate and including a second terminal, the second terminal being electrically connected to the first terminal via a connecting portion provided on the first wiring substrate, the connecting portion having a first end connected to the first terminal and a second end connected to the second terminal; and
- a monitor unit provided on the second wiring substrate and electrically connected to the second terminal.

* * * * *